(12) United States Patent
Kim et al.

(10) Patent No.: US 11,854,989 B2
(45) Date of Patent: Dec. 26, 2023

(54) SEMICONDUCTOR PACKAGE SUBSTRATE AND SEMICONDUCTOR PACKAGE INCLUDING THE SAME

(71) Applicant: SAMSUNG ELECTRONICS CO., LTD., Suwon-si (KR)

(72) Inventors: Dongho Kim, Seoul (KR); Jongbo Shim, Asan-si (KR); Hwan Pil Park, Hwaseong-si (KR); Choongbin Yim, Seoul (KR); Jungwoo Kim, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 17/167,789

(22) Filed: Feb. 4, 2021

(65) Prior Publication Data
US 2021/0407923 A1   Dec. 30, 2021

(30) Foreign Application Priority Data

Jun. 25, 2020   (KR) ..................... 10-2020-0078007

(51) Int. Cl.
| | | |
|---|---|---|
| *H01L 23/538* | (2006.01) | |
| *H01L 23/13* | (2006.01) | |
| *H01L 23/31* | (2006.01) | |
| *H01L 23/00* | (2006.01) | |

(Continued)

(52) U.S. Cl.
CPC .......... *H01L 23/5389* (2013.01); *H01L 23/13* (2013.01); *H01L 23/3128* (2013.01); *H01L 23/5383* (2013.01); *H01L 23/5386* (2013.01); *H01L 24/20* (2013.01); *H01L 25/0657* (2013.01); *H01L 25/105* (2013.01); *H01L 2224/214* (2013.01); *H01L 2225/0651* (2013.01); *H01L 2225/06586* (2013.01);

(Continued)

(58) Field of Classification Search
CPC . H01L 23/5389; H01L 23/13; H01L 23/3128; H01L 23/5383; H01L 23/5386; H01L 24/20; H01L 25/0657; H01L 25/105; H01L 2224/214; H01L 2225/0651; H01L 2225/06586; H01L 2225/1035; H01L 2225/1058; H01L 2924/19103
See application file for complete search history.

(56) References Cited

U.S. PATENT DOCUMENTS

| | | |
|---|---|---|
| 6,272,020 B1 | 8/2001 | Tosaki et al. |
| 7,583,512 B2 | 9/2009 | Ryu et al. |

(Continued)

FOREIGN PATENT DOCUMENTS

KR   10-2016-0116836   10/2016

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package substrate includes a substrate having a bottom surface including a cavity structure defined therein. The cavity structure includes a floor surface. A passive device structure has at least a partial portion of the passive device structure disposed in the cavity structure. The passive device structure includes a first passive device and a second passive device that are each electrically connected to the floor surface of the cavity structure. At least partial portions of the first passive device and the second passive device vertically overlap each other.

20 Claims, 11 Drawing Sheets

(51) Int. Cl.
*H01L 25/10* (2006.01)
*H01L 25/065* (2023.01)

(52) U.S. Cl.
CPC .......... *H01L 2225/1035* (2013.01); *H01L 2225/1058* (2013.01); *H01L 2924/19103* (2013.01)

(56) References Cited

U.S. PATENT DOCUMENTS

| | | | |
|---|---|---|---|
| 7,863,735 B1* | 1/2011 | Cho | H01L 25/16 |
| | | | 257/723 |
| 8,218,330 B2 | 7/2012 | Bang et al. | |
| 8,264,846 B2 | 9/2012 | Jones et al. | |
| 10,297,542 B2 | 5/2019 | Hossain et al. | |
| 2008/0296056 A1* | 12/2008 | Kinoshita | H05K 1/183 |
| | | | 29/846 |
| 2012/0005887 A1 | 1/2012 | Mortensen et al. | |
| 2012/0121272 A1* | 5/2012 | Kropp | G02B 6/4279 |
| | | | 398/182 |
| 2014/0183711 A1* | 7/2014 | Soller | H01L 23/3675 |
| | | | 438/122 |
| 2015/0334841 A1* | 11/2015 | Schmid | H05K 1/115 |
| | | | 361/761 |
| 2019/0156073 A1* | 5/2019 | Finn | G06K 19/07743 |
| 2020/0008302 A1 | 1/2020 | Jain et al. | |

* cited by examiner

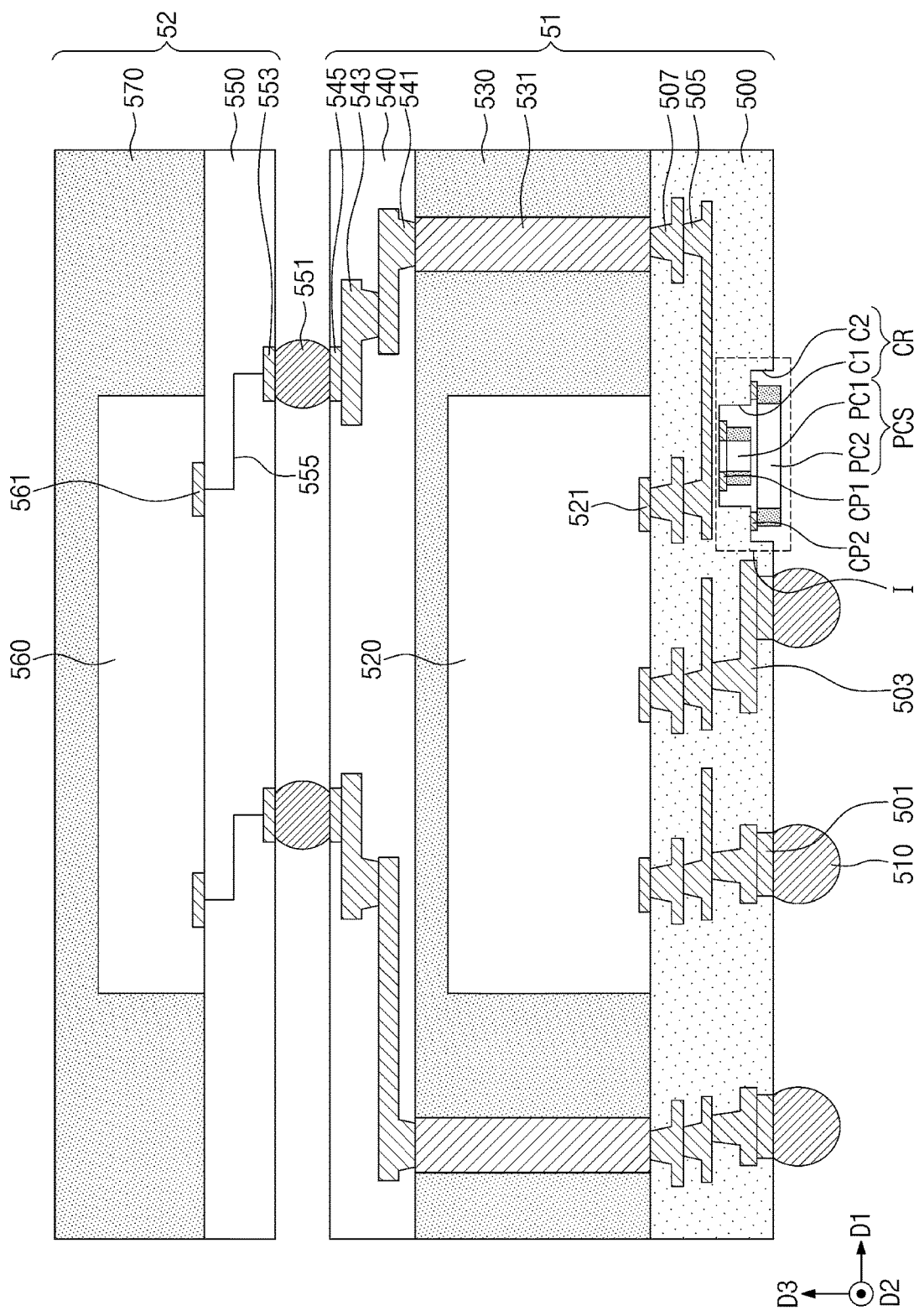

SEMICONDUCTOR PACKAGE SUBSTRATE AND SEMICONDUCTOR PACKAGE INCLUDING THE SAME

CROSS-REFERENCE TO RELATED APPLICATION

This application claims priority under 35 U.S.C. § 119 to Korean Patent Application No. 10-2020-0078007, filed on Jun. 25, 2020 in the Korean Intellectual Property Office, the disclosure of which is incorporated by reference in its entirety herein.

1. TECHNICAL FIELD

The present inventive concepts relate to a semiconductor package substrate, and more particularly, to a semiconductor package substrate including a passive device in a cavity and a semiconductor package including the semiconductor package substrate.

2. DISCUSSION OF RELATED ART

A semiconductor package is provided for applying an integrated circuit chip in electronic products. A semiconductor package is typically configured such that a semiconductor chip is mounted on a printed circuit board (PCB) and bonding wires or bumps are used to electrically connect the semiconductor chip to the printed circuit board. As the electronic industry has developed, the demand for electronic products having high performance, high speed, and compact size has increased. A wafer level package and a panel level package have been provided to provide electronic products having high performance, high speed and compact size.

SUMMARY

Some exemplary embodiments of the present inventive concepts provide a semiconductor package substrate with increased electrical characteristics and reduced size and a semiconductor package including the semiconductor package substrate.

An object of the present inventive concepts is not limited to those mentioned above, and other objects which have not been mentioned above will be clearly understood to those skilled in the art from the following description.

According to an exemplary embodiment of the present inventive concepts, a semiconductor package substrate includes a substrate having a bottom surface including a cavity structure defined therein. The cavity structure includes a floor surface. A passive device structure has at least a partial portion of the passive device structure disposed in the cavity structure. The passive device structure includes a first passive device and a second passive device that are each connected to the floor surface of the cavity structure. At least partial portions of the first passive device and the second passive device vertically overlap each other.

According to an exemplary embodiment of the present inventive concepts, a semiconductor package substrate includes a substrate having a bottom surface including a cavity structure defined therein. The cavity structure includes a first cavity and a second cavity. The first and second cavities have a step difference therebetween. A passive device structure is disposed in the cavity structure. The passive device structure includes a first passive device and a second passive device that are each connected to a floor surface of the cavity structure. The first cavity and the second cavity have different widths from each other. The first passive device and the second passive device are disposed in the first cavity and the second cavity, respectively.

According to an exemplary embodiment of the present inventive concepts, a semiconductor package includes a substrate having a bottom surface including a cavity structure defined therein. The cavity structure includes a first cavity and a second cavity. The first and second cavities have a step difference therebetween. A plurality of first conductive pads is disposed on a floor surface of the first cavity. A plurality of second conductive pads is disposed on a floor surface of the second cavity. A plurality of conductive vias is disposed in the substrate. Each of the conductive vias is connected to one of the plurality of first and second conductive pads. A plurality of coupling terminals is disposed on the bottom surface of the substrate. A first passive device is disposed in the first cavity and is electrically connected to the plurality of first conductive pads. A second passive device is disposed in the second cavity and is electrically connected to the plurality of second conductive pads. Each of the first and second passive devices includes a plurality of electrodes disposed at opposite lateral ends and a dielectric layer disposed between the electrodes. At least a partial portion of the first and second passive devices vertically overlap each other.

BRIEF DESCRIPTION OF THE DRAWINGS

FIGS. 9, 10, and 11 illustrate cross-sectional views showing a semiconductor package including a semiconductor package substrate according to exemplary embodiments of the present inventive concepts.

DETAILED DESCRIPTION OF EXEMPLARY EMBODIMENTS

The following will now describe in detail a semiconductor package substrate and a semiconductor package including the same in conjunction with the accompanying drawings.

Figure 1:
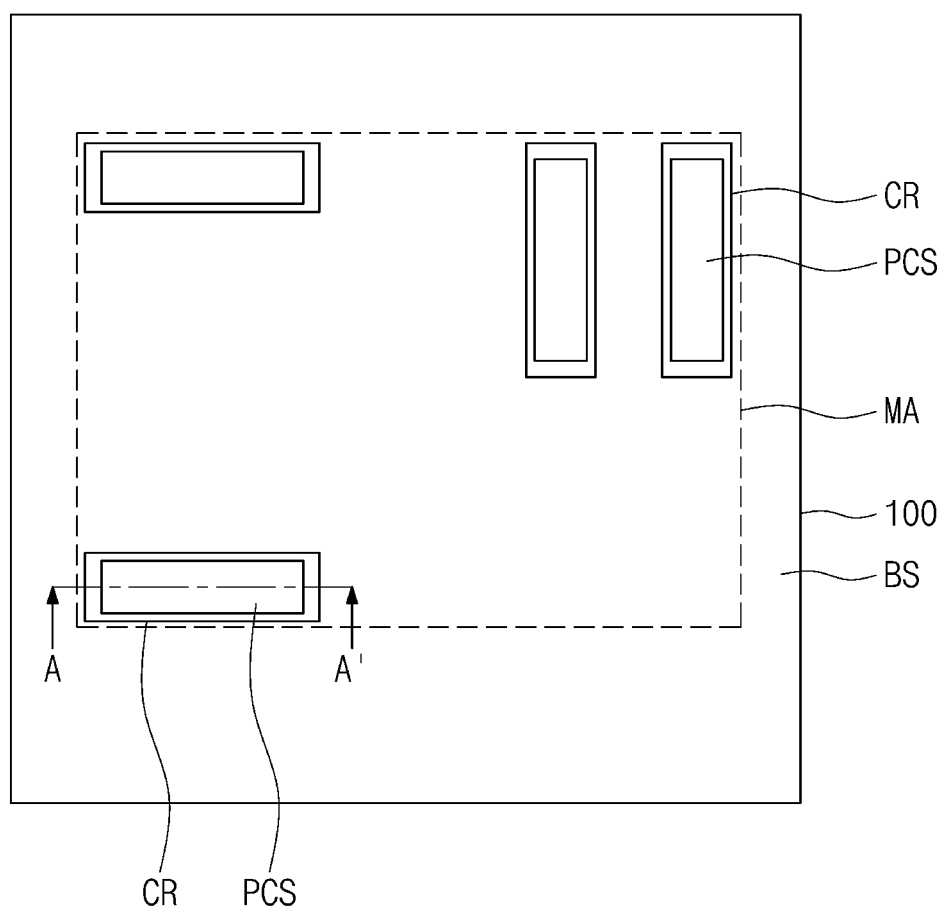
FIG. 1 illustrates a plan view of a semiconductor package substrate according to an exemplary embodiment of the present inventive concepts.
Figure 1:
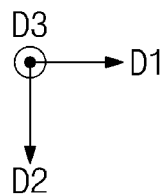
Figure 2:
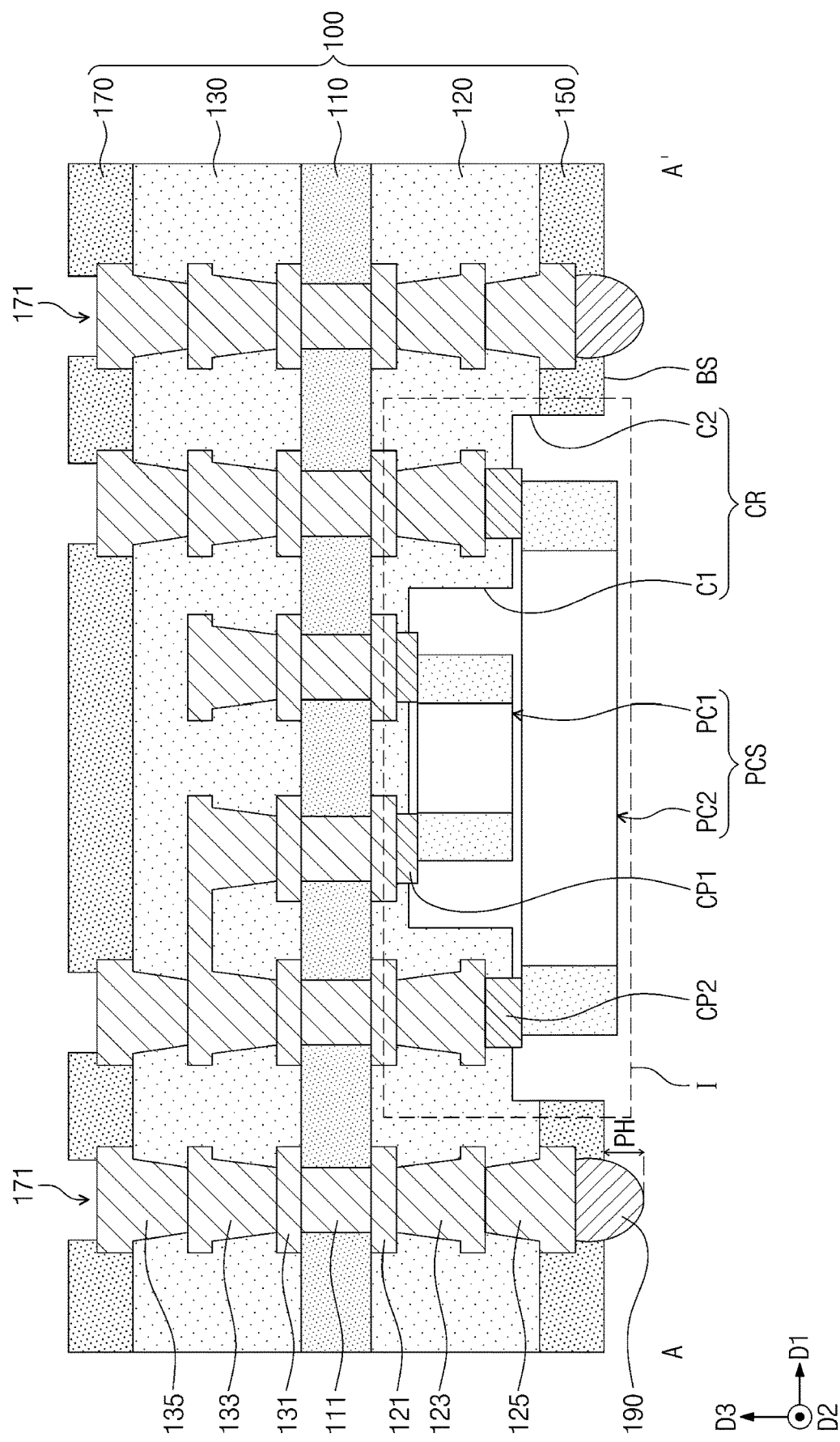
FIG. 2 illustrates a cross-sectional view taken along line A-A' of FIG. 1, showing a semiconductor package substrate according to an exemplary embodiment of the present inventive concepts.
Figure 3:
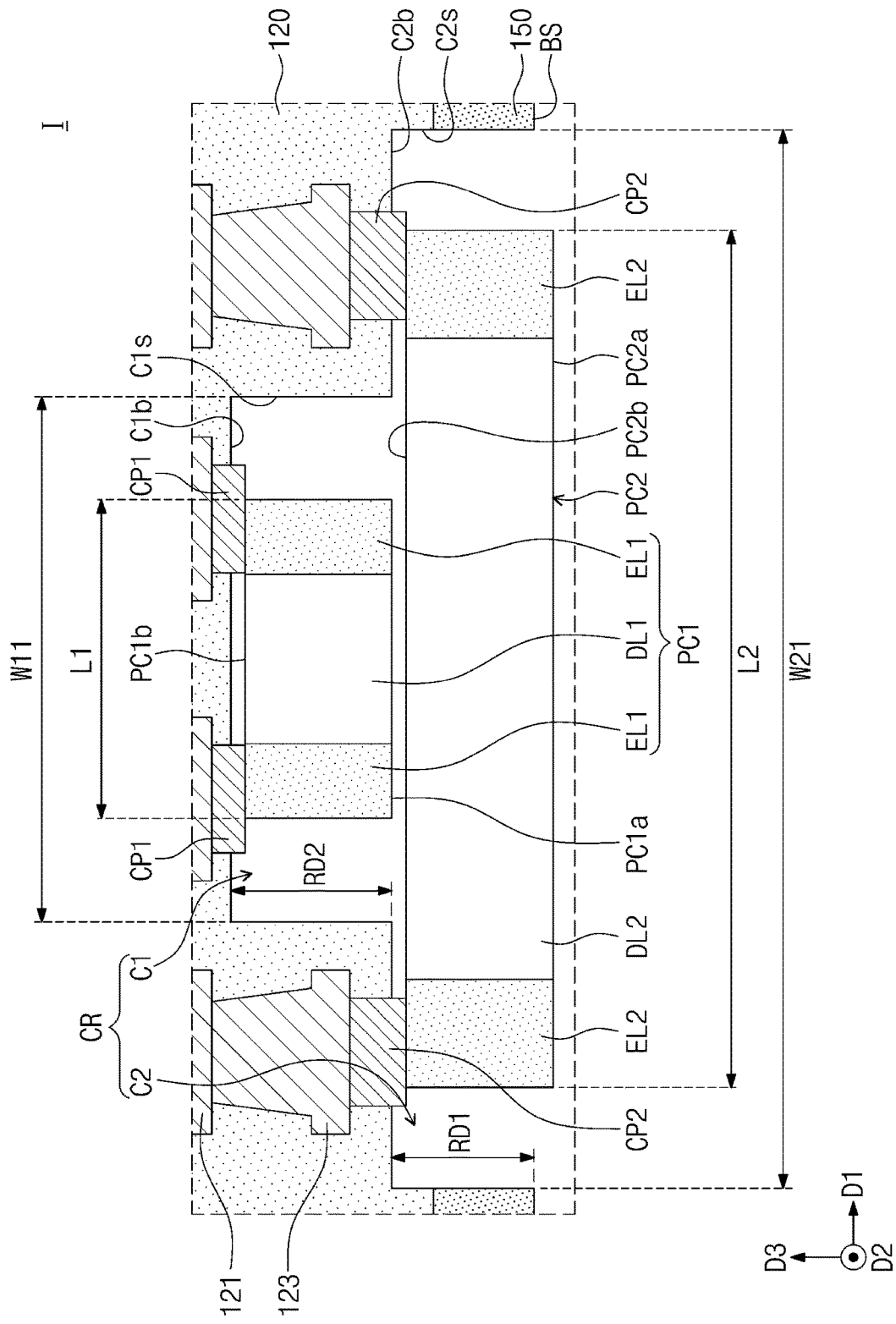
FIG. 3 illustrates an enlarged view of section I of FIG. 2, showing a passive device structure and a cavity structure of a semiconductor package substrate according to an exemplary embodiment of the present inventive concepts.
Figure 4:
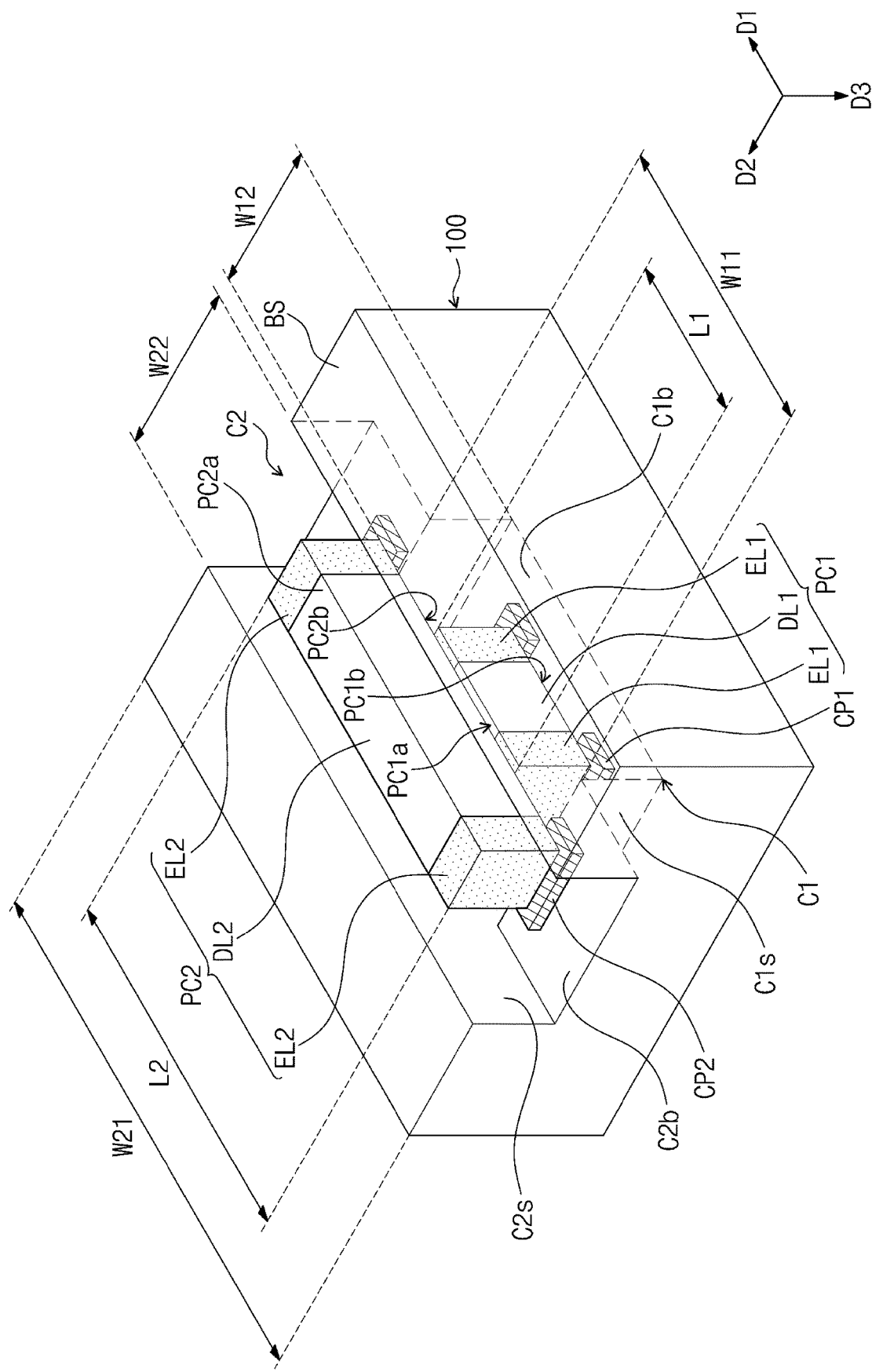
FIGS. 4 to 7 illustrate bottom perspective views showing a passive device structure and a cavity structure of a semiconductor package substrate according to exemplary embodiments of the present inventive concepts.

FIG. 1 illustrates a plan view showing a semiconductor package substrate according to an exemplary embodiment of the present inventive concepts. FIG. 2 illustrates a cross-sectional view taken along line A-A' of FIG. 1, showing a semiconductor package substrate according to an exemplary embodiment of the present inventive concepts. FIG. 3 illustrates an enlarged view of section I of FIG. 2, showing a passive device structure and a cavity structure of a semiconductor package substrate according to an exemplary embodiment of the present inventive concepts. FIG. 4 illustrates a bottom perspective view showing a passive device structure and a cavity structure of a semiconductor package substrate according to an exemplary embodiment of the present inventive concepts.

Referring to FIGS. 1 to 4, a semiconductor package substrate according to the present inventive concepts may include a substrate 100 and a passive device structure PCS. The substrate 100 may have a cavity structure CR disposed on a lower portion thereof. The passive device structure PCS may be disposed in the cavity structure CR. For example, as shown in the exemplary embodiment of FIG. 1, a plurality of cavity structures CR may be disposed on the substrate 100 and a passive device structure PCS may be disposed in each of the plurality of cavity structures CR. The exemplary embodiment of FIG. 1 shows four cavity structures CR disposed on the substrate 100 and four passive device structures PCS respectively disposed therein. However, exemplary embodiments of the present inventive concepts are not limited thereto and the numbers of the cavity structures CR and the passive device structures PCS may vary in other exemplary embodiments.

In an exemplary embodiment, the substrate 100 may be, for example, a printed circuit board (PCB) or a flexible substrate. However, exemplary embodiments of the present inventive concepts are not limited thereto. As shown in the exemplary embodiment of FIG. 2, the substrate 100 may include a core 110, a first insulating layer 120, a second insulating layer 130, a first resist layer 150, and a second resist layer 170. However, exemplary embodiments of the present inventive concepts are not limited thereto. For example, in another exemplary embodiment, the substrate 100 may be a coreless substrate, such as a printed circuit board or a flexible substrate, that does not include the core 110.

In an exemplary embodiment, the core 110 may include, for example, resin or glass fiber. The first and second insulating layers 120 and 130 may include resin. For example, the first and second insulating layers 120 and 130 may include a thermosetting resin such as an epoxy resin, a thermoplastic resin such as polyimide, a photo-curable resin, or a resin impregnated with glass fiber and/or inorganic fillers.

The core 110 may include via patterns 111 that extend in the third direction D3 which is a vertical direction, such as a thickness direction of the substrate 100. The via patterns 111 may penetrate the core 110. For example, the via patterns 111 may extend from a top surface to a lower surface of the core 110. The first insulating layer 120 may include first interconnection layers 121, first conductive patterns 123, and second conductive patterns 125 disposed therein. The second insulating layer 130 may include second interconnection layers 131, third conductive patterns 133, and fourth conductive patterns 135 disposed therein.

As shown in the exemplary embodiment of FIG. 2, the first and second interconnection layers 121 and 131 may be respectively disposed on bottom and top surfaces of the core 110. However, exemplary embodiments of the present inventive concepts are not limited thereto. In the description below, a top surface of a certain component is defined to refer to a surface that is positioned towards the third direction D3, and a bottom surface of the certain component is defined to refer to a surface that is positioned towards a direction opposite to the third direction D3. The first and second interconnection layers 121 and 131 may contact the via patterns 111 of the core 110. For example, as shown in the exemplary embodiment of FIG. 2, an upper surface of the via patterns 111 may directly contact a lower surface of the second interconnection layer 131 and a lower surface of the via patterns 111 may directly contact an upper surface of the first interconnection layer 121. The first and second conductive patterns 123 and 125 may be disposed on the first interconnection layers 121, and the third and fourth conductive patterns 133 and 135 may be disposed on the second interconnection layers 131. For example, as shown in the exemplary embodiment of FIG. 2, an upper surface of the first conductive pattern 123 may directly contact a lower surface of the first interconnection layer 121 and a lower surface of the first conductive pattern 123 may directly contact an upper surface of the second conductive pattern 125. A lower surface of the third conductive pattern 133 may directly contact an upper surface of the second interconnection layer 131 and an upper surface of the third conductive pattern 133 may directly contact a lower surface of the fourth conductive pattern 135. The second conductive patterns 125 may partially protrude downwardly from a bottom surface of the first insulating layer 120. The fourth conductive patterns 135 may partially protrude upwards from a top surface of the second insulating layer 130. A portion of each of the first and second conductive patterns 123 and 125 may have a width (e.g., a length in a first direction D1 that is parallel to an upper surface of the substrate 100) that gradually decreases in the third direction D3, and a portion of each of the third and fourth conductive patterns 133 and 135 may have a width (e.g., length in the first direction D1) that gradually increases in the third direction D3.

In an exemplary embodiment, each of the first, second, third, and fourth conductive patterns 123, 125, 133, and 135 may further include a barrier pattern that is conformally disposed on an upper or lower portion thereof. However, in other exemplary embodiments, conductive patterns may be disposed in the first and second insulating layers 120 and 130 and each of the conductive patterns is vertically connected to one of the first, second, third, and fourth conductive patterns 123, 125, 133, and 135.

The first resist layer 150 may be disposed on the first insulating layer 120. For example, as shown in the exemplary embodiment of FIG. 2, a lower surface of the first insulating layer 120 may directly contact an upper surface of the first resist layer 150. The first resist layer 150 may partially cover the second conductive patterns 125. For example, the first resist layer may cover the portion of the second conductive patterns 125 which protrude from the first insulating layer 120, such as lateral side portions of the protruding portion and lateral ends of a bottom surface of the protruding portion of the second conductive patterns 125. The first resist layer 150 may expose the cavity structure CR and portions of bottom surfaces of the second conductive patterns 125. For example, the first resist layer 150 may expose a central portion of the cavity structure CR. Coupling terminals 190 may be disposed on the portions of the bottom surfaces of the second conductive patterns 125 that are exposed by the first resist layer 150. As shown in the exemplary embodiment of FIG. 2, the coupling terminals 190 may be, for example, solder balls.

The coupling terminals 190 may protrude downwards from a bottom surface BS of the substrate 100. In an exemplary embodiment, the coupling terminals 190 may have a protrusion height PH in which the coupling terminals 190 protrude downwardly from a bottom surface BS of the substrate 100 in a range of about 10 μm to about 140 μm. The protrusion height PH is defined as a distance (e.g., a length in the third direction D3) between lowermost points of the coupling terminals 190 and the bottom surface BS of the substrate 100. For example, in an exemplary embodiment, the protrusion height PH may be in a range from about 80 μm to about 120 μm.

The second resist layer 170 may be disposed on the second insulating layer 130. The second resist layer 170 may cover partial portions of the fourth conductive patterns 135, and may have openings 171 that externally expose partial portions of the fourth conductive patterns 135. For example, as shown in the exemplary embodiment of FIG. 2, the second resist layer 170 may cover lateral sides of the portion of the fourth conductive pattern 135 that protrudes from the second insulating layer 130 and lateral ends of an upper surface of the fourth conductive pattern 135. In an exemplary embodiment, the first and second resist layers 150 and 170 may each be a dielectric coating layer. The first and second resist layers 150 and 170 may protect the first, second, third, and fourth conductive patterns 123, 125, 133, and 135.

The bottom surface BS of the substrate 100 may be partially recessed. The cavity structure CR is defined in the recessed portion of the bottom surface BS of the substrate 100 (e.g., a portion recessed in the third direction D3). The bottom surface BS of the substrate 100 may be extend in a plane defined in the first direction D1 and a second direction D2 that is also parallel to an upper surface of the substrate 100 and intersects the first direction D1. The first and second directions D1, D2 are perpendicular to the third direction D3. For example, the first, second, and third directions D1, D2, and D3 may be orthogonal to each other. However, exemplary embodiments of the present inventive concepts are not limited thereto and at least one of the first to third directions D1, D2, D3 may cross each other (e.g., intersect each other) at a different angle in other exemplary embodiments. The cavity structure CR may extend longitudinally, for example, in the first direction D1 or the second direction D2. The cavity structure CR may be defined in the first insulating layer 120 and the first resist layer 150.

The cavity structure CR may include a first cavity C1 and a second cavity C2. As shown in the exemplary embodiment of FIG. 3, the second cavity C2 may be a recessed portion that extends from the bottom surface BS of the substrate 100 a first depth RD1 in the third direction D3, and the first cavity C1 may be a recessed portion that extends from a floor surface C2b of the second cavity C2 a second depth RD2 in the third direction D3. The floor surface C2b of the second cavity C2 may be a portion of the substrate 100 that defines an upper surface of the second cavity C2. For example, the floor surface C2b of the second cavity C2 may be a portion of the first insulating layer 120. However, exemplary embodiments of the present inventive concepts are not limited thereto. As shown in the exemplary embodiment of FIG. 3, the first depth RD1 may be greater than a thickness (e.g., length in the third direction D3) of the first resist layer 150. As shown in the exemplary embodiment of FIG. 4, the first cavity C1 may have a relatively larger width W11 in the first direction D1 and a relatively smaller width W12 in the second direction D2, and likewise the second cavity C2 may have a relatively larger width W21 in the first direction D1 and a relatively smaller width W22 in the second direction D2.

For example, the width W11 in the first direction D1 of the first cavity C1 may be different from the width W21 in the first direction D1 of the second cavity C2. As shown in the exemplary embodiment of FIG. 4, the width W11 in the first direction D1 of the first cavity C1 may be less than the width W21 in the first direction D1 of the second cavity C2. For example, the width W12 in the second direction D2 of the first cavity C1 may be substantially the same as the width W22 in the second direction D2 of the second cavity C2. However, exemplary embodiments of the present inventive concepts are not limited thereto.

A step difference may be present between the first cavity C1 and the second cavity C2. The first cavity C1 may have a floor surface C1b at a different level from the level of the floor surface C2b of the second cavity C2. The floor surface C1b of the first cavity C1 may be a portion of the substrate 100 that defines an upper surface of the first cavity C1, such as a portion of the first insulating layer 120. For example, as shown in the exemplary embodiment of FIG. 4, the floor surface C1b of the first cavity C1 may be positioned at a higher level than the level of the floor surface C2b of the second cavity C2. In this description below, the language "level" is defined to have a height that gradually increases in the third direction D3 and gradually decreases in a direction opposite to the third direction D3. The first cavity C1 may have a sidewall C1s that is not aligned in part with a sidewall C2s of the second cavity C2. For example, as shown in the exemplary embodiments of FIGS. 2 and 3, the first cavity C1 and the second cavity C2 may not be aligned at their sidewalls C1s and C2s that face each other in the first direction D1, respectively.

The first cavity C1 may include first conductive pads CP1 disposed on the floor surface C1b thereof. The first conductive pads CP1 may contact ones of the first interconnection layers 121. For example, as shown in the exemplary embodiment of FIG. 2, the first conductive pads CP1 may be partially buried in the first insulating layer 120. However, exemplary embodiments of the present inventive concepts are not limited thereto. For example, in another exemplary embodiment, the first conductive pads CP1 may be entirely buried in the first insulating layer 120, and a bottom surface of each of the first conductive pads CP1 may be coplanar with the floor surface C1b of the first cavity C1.

The second cavity C2 may include second conductive pads CP2 disposed on the floor surface C2b thereof. The second conductive pads CP2 may contact ones of the first conductive patterns 123. The second conductive pads CP2 may be positioned at a different level from the level of the first conductive pads CP1. For example, the second conductive pads CP2 may be located at a lower level than the level of the first conductive pads CP1. For example, the second conductive pads CP2 may be partially buried in the first insulating layer 120. However, exemplary embodiments of the present inventive concepts are not limited thereto. For example, in another exemplary embodiment, the second conductive pads CP2 may be entirely buried in the first insulating layer 120, and a bottom surface of each of the second conductive pads CP2 may be coplanar with the floor surface C2b of the second cavity C2.

At least a partial portion of the passive device structure PCS may be disposed in the cavity structure CR. Since at least a partial portion of the passive device structure PCS is disposed in the cavity structure CR, the protrusion height PH of the coupling terminals 190 may be reduced. The reduction in the protrusion height PH of the coupling terminals 190 may decrease a thickness in the third direction D3 of the semiconductor package substrate and may also decrease a total thickness in the third direction D3 of a semiconductor package including the semiconductor package substrate. In addition, the coupling terminals 190 may have reduced widths in the first direction D1 and the second direction D2, and may also have a reduced pitch.

In an exemplary embodiment, the passive device structure PCS may be provided in plural. The substrate 100 may include a passive device mount region MA on a lower portion thereof and the plurality of passive device structures PCS may be disposed thereon. For convenience of description, a single passive device structure PCS will be discussed below. However, exemplary embodiments of the present inventive concepts are not limited thereto.

As shown in the exemplary embodiment of FIG. 2, the passive device structure PCS may include a first passive device PC1 disposed in the first cavity C1 and a second passive device PC2 disposed in the second cavity C2. For example, in an exemplary embodiment, the first and second passive devices PC1 and PC2 may be capacitors. For example, in an exemplary embodiment, the first and second passive devices PC1 and PC2 may each be a multi-layered ceramic capacitor (MLCC) in which a plurality of ceramic dielectric layers are stacked alternately with a plurality of internal electrode layers. The following will discuss an exemplary embodiment in which the multi-layered ceramic capacitor is adopted as each of the first and second passive devices PC1 and PC2. However, exemplary embodiments of the present inventive concepts are not limited thereto.

As shown in the exemplary embodiments of FIGS. 3-4, the first passive device PC1 may include first electrodes EL1 disposed at opposite lateral sides (e.g., opposite lateral ends in the first direction D1) and a first dielectric layer DL1 interposed between the first electrodes EL1. The first passive device PC1 may have a first surface PC1a adjacent to the second passive device PC2 (e.g., adjacent in the third direction D3) and a second surface PC1b adjacent to the floor surface C1b of the first cavity C1. For example, the first surface PC1a may be a bottom surface of the first passive device PC1 and the second surface PC1b may be a top surface of the first passive device PC1. Similarly, the second passive device PC2 may include second electrodes EL2 disposed at opposite lateral sides (e.g., opposite lateral ends in the first direction D1) and a second dielectric layer DL2 interposed between the second electrodes EL2. The second passive device PC2 may have a first surface PC2a externally exposed and a second surface PC2b adjacent to the first passive device PC1 (e.g., adjacent in the third direction D3). For example, the first surface PC2a may be a bottom surface of the second passive device PC2 and the second surface PC2b may be a top surface of the second passive device PC2.

The first surface PC1a of the first passive device PC1 may be positioned at a level that is the same as or higher than the level of the floor surface C2b of the second cavity C2. For example, the first surface PC2a of the second passive device PC2 may be positioned at a lower level than the level of the bottom surface BS of the substrate 100 and a partial portion of the second passive device PC2 may not be disposed in the second cavity C2 and is disposed outside of the cavity structure CR. However, exemplary embodiments of the present inventive concepts are not limited thereto. For example, in another exemplary embodiment, the first surface PC2a of the second passive device PC2 may be positioned at a level that is the same as or higher than the level of the bottom surface BS of the substrate 100. In an exemplary embodiment in which the first surface PC2a of the second passive device PC2 is positioned at a level that is the same as or higher than the level of the bottom surface BS of the substrate 100, the passive device structure PCS may be disposed entirely in the cavity structure CR.

The first electrodes EL1 may be disposed to face each other in the first direction D1, and likewise the second electrodes EL2 may be disposed to face each other in the first direction D1. The first electrodes EL1 may be spaced apart in the first and second directions D1 and D2 from the sidewall C1s of the first cavity C1. The second electrodes EL2 may be spaced apart in the first and second directions D1 and D2 from the sidewall C2s of the second cavity C2. The first passive device PC1 may have a total first length L1 in the first direction D1 (e.g., a length of an entire portion of the first passive device PC1 in the first direction D1) that is less than the total width W11 in the first direction D1 of the first cavity C1 (e.g., a width of an entire portion of the first cavity C1 in the first direction D1), and may have a total width in the second direction D2 (e.g., a width of an entire portion of the first passive device PC1 in the second direction D2) that is less than the total width W12 in the second direction D2 of the first cavity C1 (e.g., a width of an entire portion of the first cavity C1 in the second direction D2). Similarly, the second passive device PC2 may have a total second length L2 in the first direction D1 that is less than the total width W21 in the first direction D1 of the second cavity C2, and may have a total width in the second direction D2 that is less than the total width W22 in the second direction D2 of the second cavity C2. The second length L2 of the second passive device PC2 may be greater than the width W11 in the first direction D1 of the first cavity C1.

The first and second passive devices PC1 and PC2 may each be electrically connected to a floor surface of the cavity structure CR. For example, the first electrodes EL1 of the first passive device PC1 may be connected to corresponding first conductive pads CP1 (e.g., physically and electrically connected), and the second electrodes EL2 of the second passive device PC2 may be connected to corresponding second conductive pads CP2 (e.g., physically and electrically connected). The second surface PC1b of the first passive device PC1 may be spaced apart in the third direction D3 from the floor surface C1b of the first cavity C1 due to the first conductive pads CP1. The second surface PC2b of the second passive device PC2 may be spaced apart in the third direction D3 from the first surface PC1a of the first passive device PC1 due to the second conductive pads CP2.

The first length L1 in the first direction D1 of the first passive device PC1 may be less than the second length L2 in the first direction D1 of the second passive device PC2. The first passive device PC1 and the second dielectric layer DL2 of the second passive device PC2 may overlap vertically (e.g., in the third direction D3). Since the cavity structure CR has the stepped structure, and since the first length L1 in the first direction D1 of the first passive device PC1 is different from the second length L2 in the first direction D1 of the second passive device PC2, the second electrodes EL2 of the second passive device PC2 and the first electrodes EL1 of the first passive device PC1 may not overlap vertically (e.g., in the third direction D3). Since the first and second electrodes EL1 and EL2 do not overlap each other in the third direction D3, an electrical short may be prevented between the first and second electrodes EL1 and EL2.

According to exemplary embodiments of the present inventive concepts, since the passive device structure PCS is disposed in the cavity structure CR and the first and second passive devices PC1 and PC2 stacked in one cavity structure CR, a semiconductor package may have an increased electrical property, a relatively small thickness, and a reduced area of the passive device mount region MA. Additionally, since the first and second passive devices PC1 and PC2 of the passive device structure PCS are independently connected to the substrate 100 through the first and second conductive pads CP1 and CP2 that are different from each other, a semiconductor package may have an increased degree of freedom for interconnection layer design.

Figure 5:
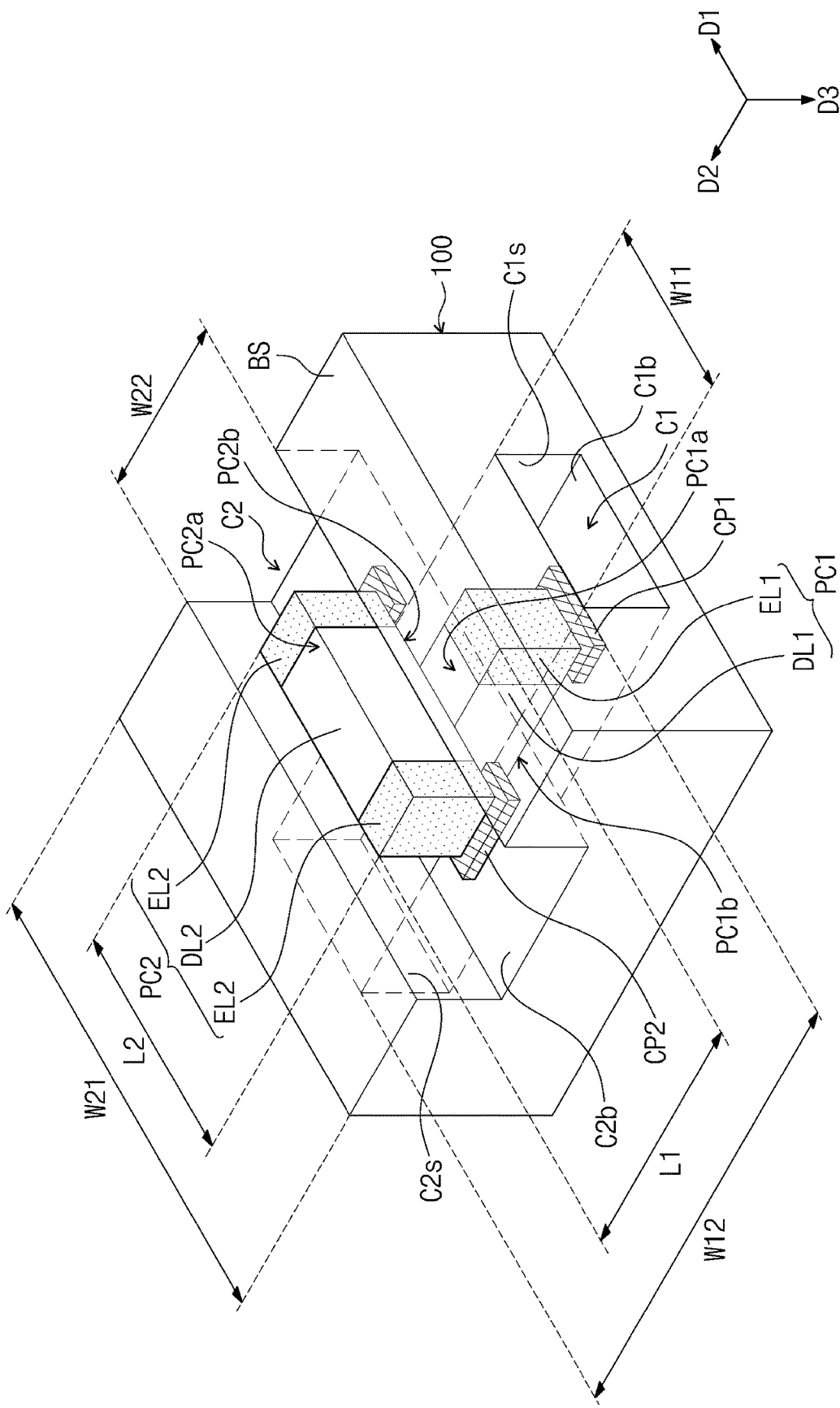

FIG. 5 illustrates a perspective view showing a passive device structure and a cavity structure of a semiconductor package substrate according to an exemplary embodiment of the present inventive concepts. FIG. 5 is a bottom perspective view of the passive device structure and the cavity structure. For convenience of description below, a description of substantially identical elements as previously described in the exemplary embodiments of FIGS. 1-4 may be omitted.

Referring to the exemplary embodiment of FIG. 5, the first cavity C1 may have a shape that extends longitudinally in the second direction D2, and the second cavity C2 may have a shape that extends longitudinally in the first direction D1. For example, the first cavity C1 may have a relatively smaller total width W11 in the first direction D1 and a relatively larger total width W12 in the second direction D2, and the second cavity C2 may have a relatively larger total width W21 in the first direction D1 and a relatively smaller total width W22 in the second direction D2. The first and second cavities C1 and C2 may have their centers that overlap vertically (e.g., in the third direction D3).

The first passive device PC1 may extend longitudinally in the second direction D2 along which the first cavity C1 longitudinally extends. For example, the first electrodes EL1 of the first passive device PC1 may be disposed to face each other in the second direction D2. The first electrodes EL1 may be spaced apart in the first and second directions D1 and D2 from the sidewall C1s of the first cavity C1. The first passive device PC1 may have a total first length L1 in the second direction D2 that is less than the total width W12 in the second direction D2 of the first cavity C1, and may have a total width in the first direction D1 that is less than the total width W11 in the first direction D1 of the first cavity C1. The first electrodes EL1 may be electrically connected to the first conductive pads CP1 that are disposed to face each other in the second direction D2.

The second passive device PC2 may extend longitudinally in the first direction D1 along which the second cavity C2 longitudinally extends. For example, the second electrodes EL2 of the second passive device PC2 may be disposed to face each other in the first direction D1. The second electrodes EL2 may be spaced apart in the first and second directions D1 and D2 from the sidewall C2s of the second cavity C2. The second passive device PC2 may have a total second length L2 in the first direction D1 that is less than the width W21 in the first direction D1 of the second cavity C2, and may have a total width in the second direction D2 that is less than the total width W22 in the second direction D2 of the second cavity C2. The second electrodes EL2 may be electrically connected to the second conductive pads CP2 that are disposed to face each other in the first direction D1.

The first and second passive devices PC1 and PC2 may have portions that vertically overlap each other e.g., (overlap in the third direction D3). As shown in the exemplary embodiment of FIG. 5, the first length L1 of the first passive device PC1 may be substantially the same as the second length L2 of the second passive device PC2. However, exemplary embodiments of the present inventive concepts are not limited thereto. For example, in other exemplary embodiments, the first and second lengths L1 and L2 may be different from each other. As shown in the exemplary embodiment of FIG. 5, the second length L2 of the second passive device PC2 may be greater than the width W11 in the first direction D1 of the first cavity C1.

Since the first and second passive devices PC1 and PC2 extend longitudinally in different directions from each other, the first and second electrodes EL1 and EL2 of the first and second passive devices PC1 and PC2 may not overlap vertically or in the third direction D3. Since the first and second electrodes EL1 and EL2 do not overlap in the third direction D3, an electrical short may be prevented between the first and second electrodes EL1 and EL2.

Figure 6:
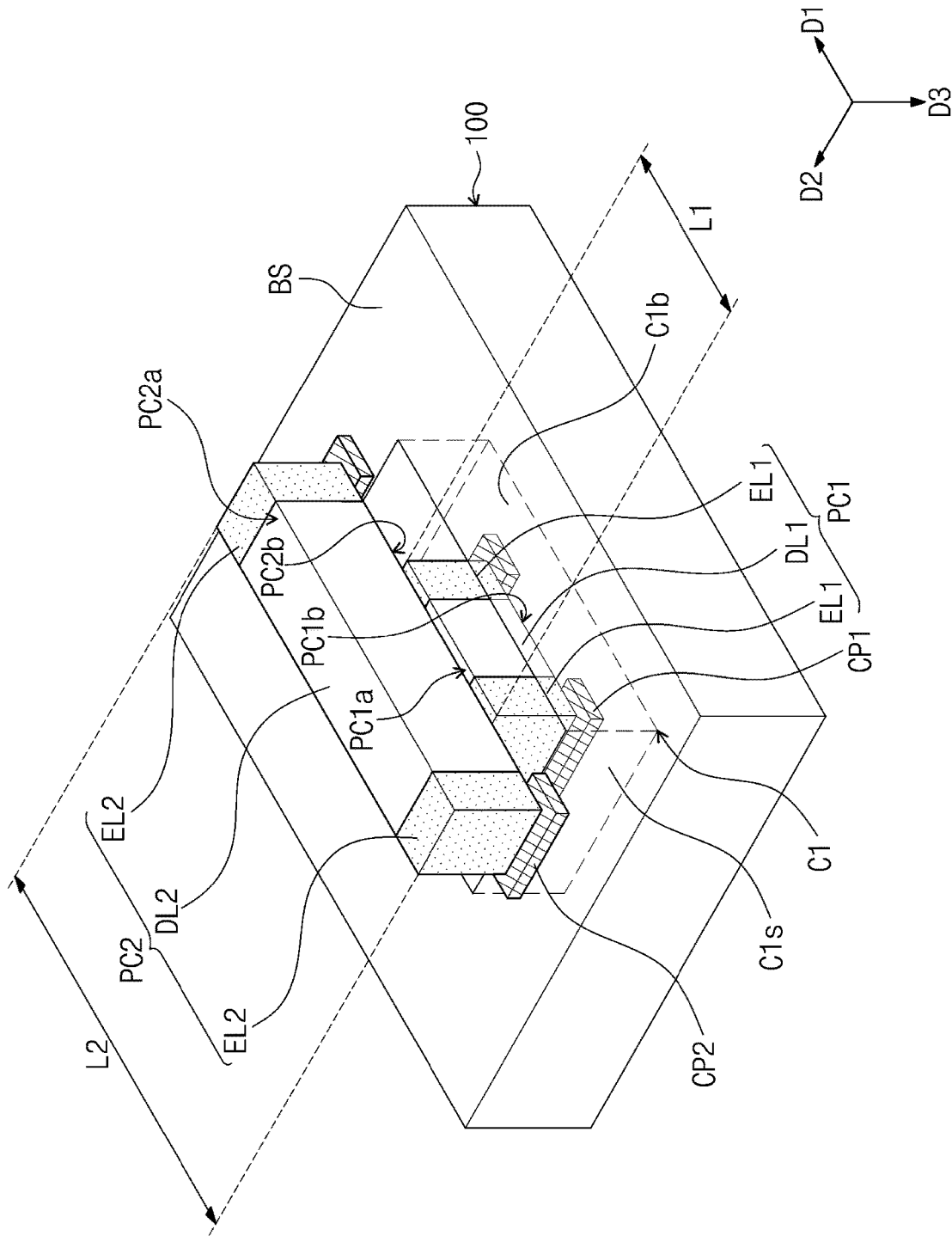

FIG. 6 illustrates a perspective view showing a passive device structure and a cavity structure of a semiconductor package substrate according to an exemplary embodiment of the present inventive concepts. For convenience of description below, omission will be made to avoid explanation about the features substantially the same as those discussed above.

Referring to the exemplary embodiment of FIG. 6, the bottom surface BS of the substrate 100 may be partially recessed. The first cavity C1 may be a recession that is formed when a partial portion of the bottom surface BS of the substrate 100 is recessed in the third direction D3. The first cavity C1 may have a shape that extends longitudinally in the first direction D1. For example, the first cavity C1 may have a relatively larger total width in the first direction D1 and a relatively smaller total width in the second direction D2.

The first passive device PC1 may be disposed in the first cavity C1. The first passive device PC1 may extend longitudinally in the first direction D1 along which the first cavity C1 longitudinally extends. The first electrodes EL1 of the first passive device PC1 may be disposed to face each other in the first direction D1. In an exemplary embodiment, the first surface PC1a of the first passive device PC1 may be positioned at a level the same as or higher than the level of the bottom surface BS of the substrate 100.

The second passive device PC2 may be disposed outside the first cavity C1 and may not be disposed in the cavity structure CR. For example, the second conductive pads CP2 may be disposed on the bottom surface BS of the substrate 100 and the second passive device PC2 may extend below the bottom surface BS of the substrate 100. The second passive device PC2 may extend longitudinally along the first direction D1. The second electrodes EL2 of the second passive device PC2 may be disposed to face each other in the first direction D1. The first passive device PC1 may have a total first length L1 in the first direction D1 that is less than a total second length L2 in the first direction D1 of the second passive device PC2. The first passive device PC1 and the second dielectric layer DL2 of the second passive device PC2 may overlap vertically (e.g., in the third direction D3).

Figure 7:
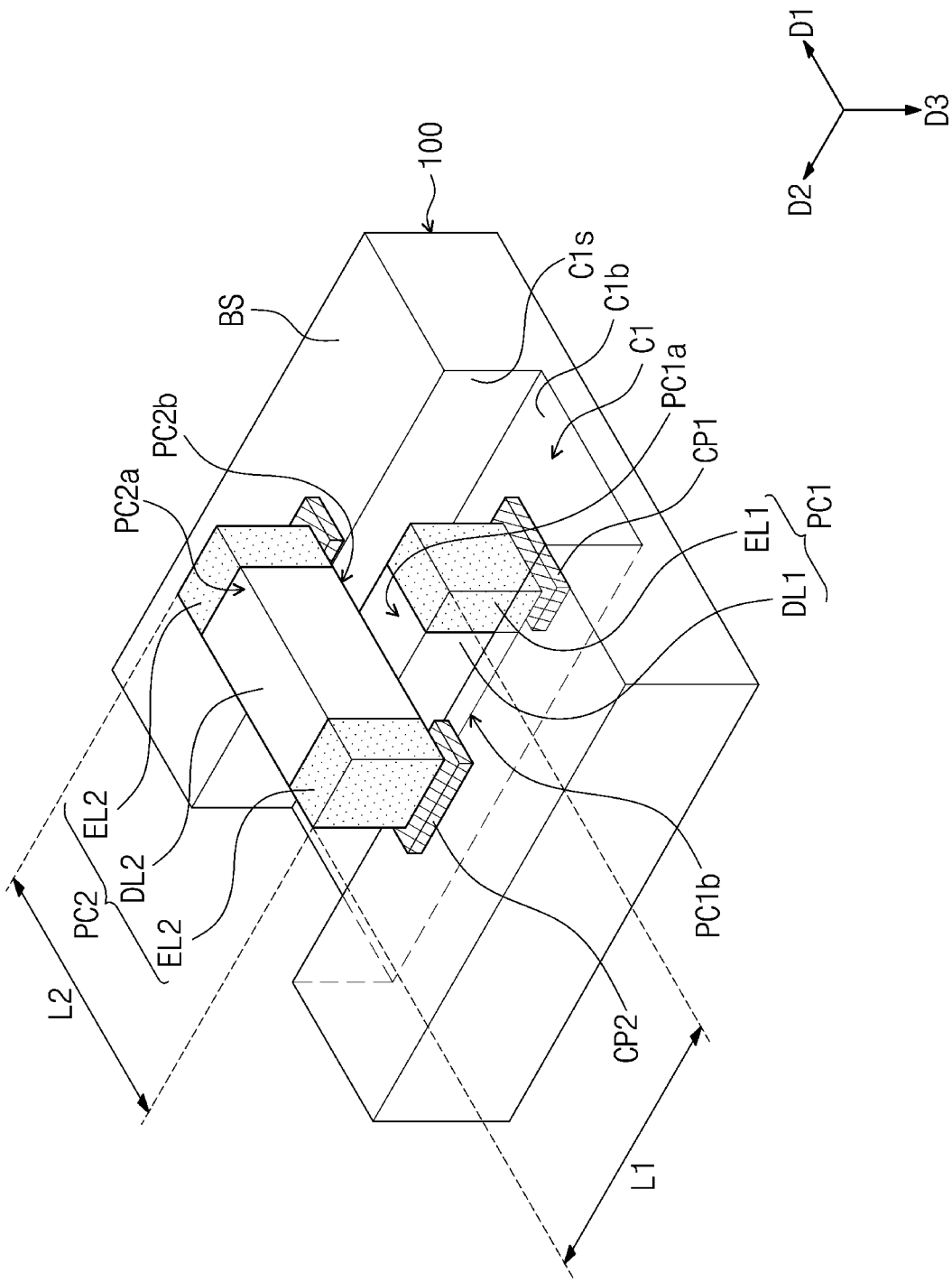

FIG. 7 illustrates a perspective view showing a passive device structure and a cavity structure of a semiconductor package substrate according to an exemplary embodiment of the present inventive concepts. For convenience of description below, a description of substantially identical elements as previously described in the prior exemplary embodiments may be omitted.

Referring to the exemplary embodiment of FIG. 7, the bottom surface BS of the substrate 100 may be partially recessed. The first cavity C1 may be a recession of a bottom surface BS of the substrate 100 in the third direction D3. The first cavity C1 may have a shape that extends longitudinally in the second direction D2. For example, the first cavity C1 may have a relatively larger total width in the second direction D2 and a relatively smaller total width in the first direction D1.

The first passive device PC1 may be disposed in the first cavity C1. The first passive device PC1 may extend longitudinally in the second direction D2 along which the first cavity C1 longitudinally extends. The first electrodes EL1 of the first passive device PC1 may be disposed to face each other in the second direction D2.

The second passive device PC2 may be disposed outside the first cavity C1. For example, the second conductive pads CP2 may be disposed on the bottom surface BS of the substrate 100 and the second passive device PC2 may extend below the bottom surface BS of the substrate 100 and outside of the cavity structure CR. The second passive device PC2 may extend longitudinally along the first direction D1. The second electrodes EL2 of the second passive device PC2 may be disposed to face each other in the first direction D1. The first passive device PC1 and at least a portion of the second dielectric layer DL2 of the second passive device PC2 may overlap vertically (e.g., in the third direction D3). The second passive device PC2 may have a total second length L2 in the first direction that is greater than a total width in the first direction D1 of the first cavity C1.

Figure 8:
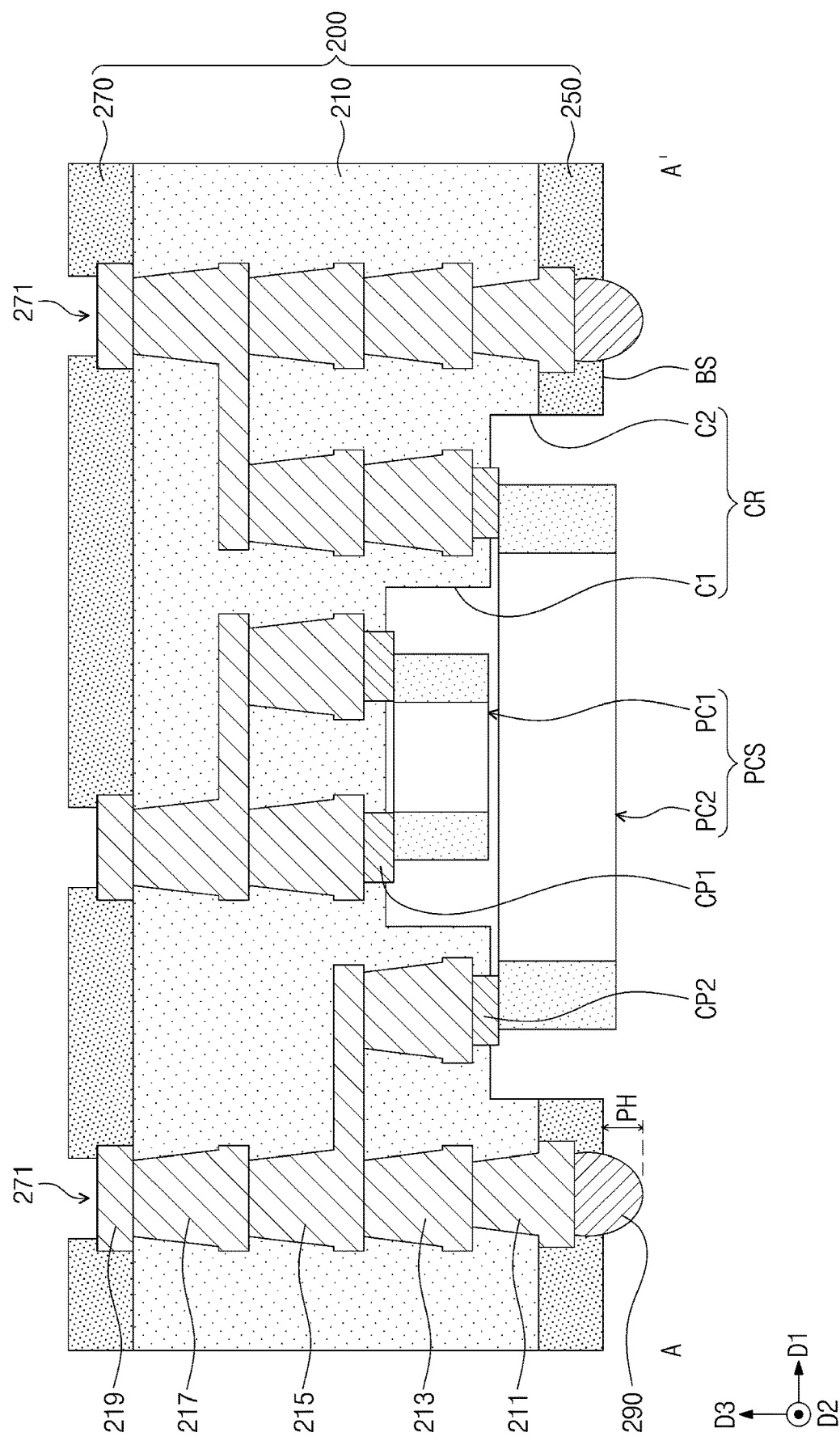
FIG. 8 illustrates a cross-sectional view taken along line A-A' of FIG. 1, showing a semiconductor package substrate according to an exemplary embodiment of the present inventive concepts.

FIG. 8 illustrates a cross-sectional view taken along line A-A' of FIG. 1, showing a semiconductor package substrate according to an exemplary embodiment of the present inventive concepts. For convenience of description below, a description of substantially identical elements as previously described in the prior exemplary embodiments may be omitted.

Referring to the exemplary embodiment of FIG. 8, a semiconductor package substrate according to the present inventive concepts may include a substrate 200 and a passive device structure PCS. The substrate 200 may have a cavity structure CR defined on a lower portion thereof. The passive device structure PCS may be disposed in the cavity structure CR.

In an exemplary embodiment, the substrate 200 may be, for example, a printed circuit board (PCB) or a flexible substrate. However, exemplary embodiments of the present inventive concepts are not limited thereto. As shown in the exemplary embodiment of FIG. 8, the substrate 200 may include a dielectric layer 210, a first resist layer 250, and a second resist layer 270. The first and second resist layers 250 and 270 may be respectively disposed on bottom and top surface of the dielectric layer 210. The cavity structure CR may be defined in a lower portion of the dielectric layer 210 and the first resist layer 250.

The first, second, third, and fourth conductive patterns 211, 213, 215, and 217 may be disposed within the dielectric layer 210. As shown in the exemplary embodiment of FIG. 8, the first, second, third, and fourth conductive patterns 211, 213, 215, and 217 may be sequentially arranged in a third direction D3 from a bottom surface BS of the substrate 200, and the first, second, third, and fourth conductive patterns 211, 213, 215, and 217 may be vertically connected to each other.

The first conductive patterns 211 may partially protrude downwardly from the bottom surface of the dielectric layer 210. Ones of the third conductive patterns 215 may be connected to a plurality of second conductive patterns 213. For example, as shown in the exemplary embodiment of FIG. 8, at least one of third conductive patterns 215 is connected to two of second conductive patterns 213. However, exemplary embodiments of the present inventive concepts are not limited thereto. Ones of the fourth conductive patterns 217 may be connected to a plurality of third conductive patterns 215. For example, as shown in the exemplary embodiment of FIG. 8, at least one of fourth conductive patterns 217 is connected to two of third conductive patterns 215. However, exemplary embodiments of the present inventive concepts are not limited thereto. A portion of each of the first, second, third, and fourth conductive patterns 211, 213, 215, and 217 may have a width in the first direction D1 that gradually decreases in the third direction D3. A plurality of fifth conductive patterns 219 may be disposed on a top surface of the fourth conductive patterns 217 and the top surface of the dielectric layer 210.

Ones of the third conductive patterns 215 may be in contact with first conductive pads CP1, and ones of the second conductive patterns 213 may be in contact with second conductive pads CP2. In an exemplary embodiment, each of the first, second, third, and fourth conductive patterns 211, 213, 215, and 217 may further include a barrier pattern that is conformally disposed on an upper or lower portion thereof. In another exemplary embodiment, the semiconductor package substrate may be configured such that the dielectric layer 210 further includes therein conductive patterns each of which is vertically connected to one of the first, second, third, and fourth conductive patterns 211, 213, 215, and 217.

The first resist layer 250 may be disposed to cover the bottom surface of the dielectric layer 210, lateral ends of the portion of the first conductive pattern 211 protruding downwardly from the dielectric layer 210 and partial portions of the bottom surfaces of the first conductive patterns 211. The second resist layer 270 may be disposed to cover the top surface of the dielectric layer 210, lateral ends of the fifth conductive patterns 219 and partial portions of top surfaces of the fifth conductive patterns 219. The first resist layer 250 may expose the cavity structure CR and partial portions of the bottom surfaces of the first conductive patterns 211. For example, as shown in the exemplary embodiment of FIG. 8, the first resist layer 250 may expose a central portion of the bottom surface of the first conductive patterns 211. Coupling terminals 290 may be disposed on the partial portion of the bottom surfaces of the first conductive pattern 211 that are exposed by the first resist layer 250. In an exemplary embodiment, the coupling terminals 290 may be, for example, solder balls.

The coupling terminals 290 may protrude downwards from a bottom surface BS of the substrate 200. In an exemplary embodiment, the protrusion height PH may be in a range of about 10 μm to about 140 μm. The protrusion height PH may be a distance in the third direction D3 between lowermost points of the coupling terminals 290 and the bottom surface BS of the substrate 200. For example, in an exemplary embodiment, the protrusion height PH may range from about 80 μm to about 120 μm.

The second resist layer 270 may cover partial portions of the fifth conductive patterns 219, and may have openings 271 that externally expose other portions of the fifth conductive patterns 219. For example, as shown in the exemplary embodiment of FIG. 8, the second resist layer 270 may cover lateral sides and lateral ends of an upper portion of the fifth conductive patterns 219 and the openings 271 may be defined in a central portion of the upper surface of the fifth conductive patterns 219. In an exemplary embodiment, the first and second resist layers 250 and 270 may each be a dielectric coating layer. The first and second resist layers 250 and 270 may protect the first, second, third, fourth, and fifth conductive patterns 211, 213, 215, 217, and 219.

Figure 9:
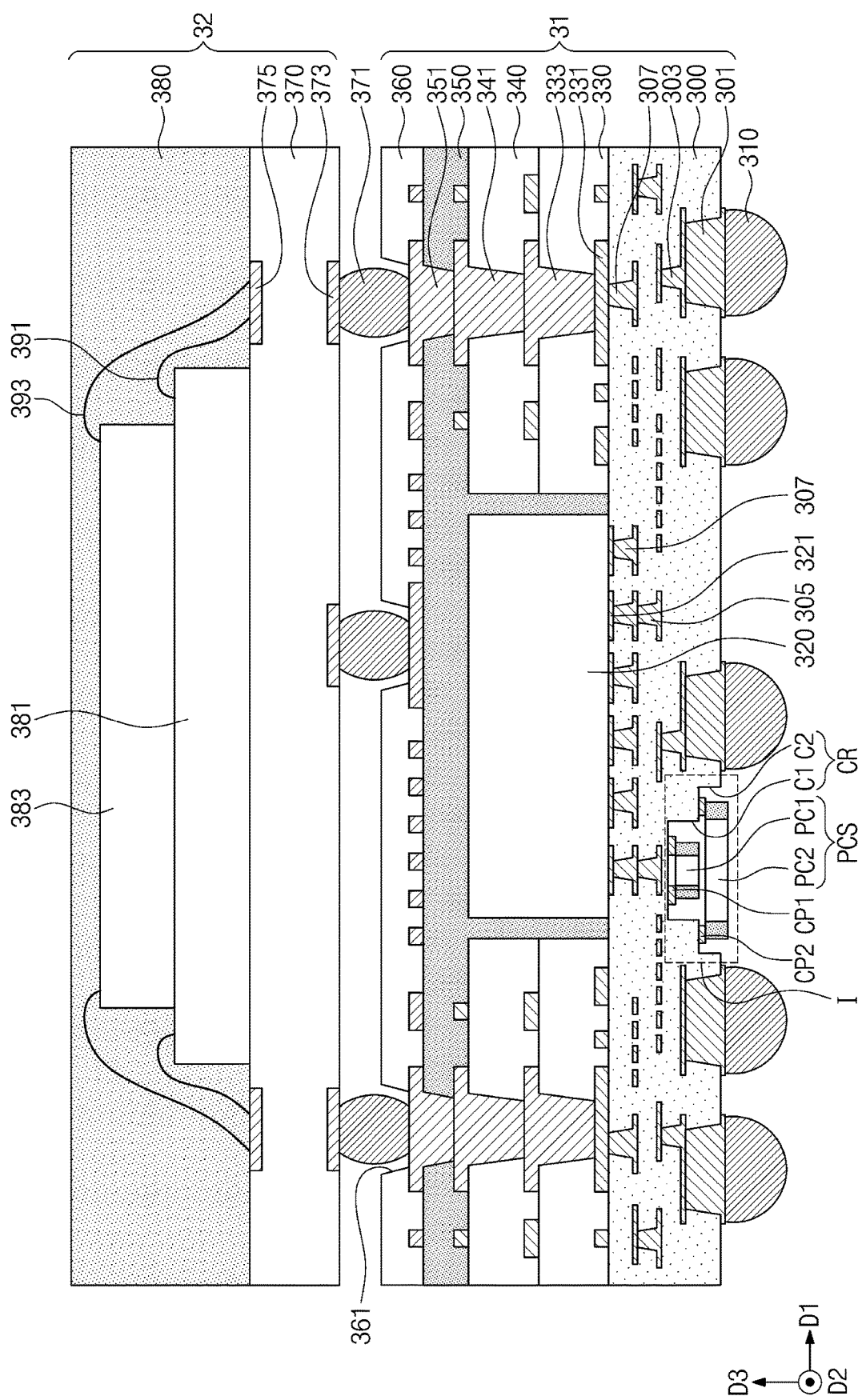

FIG. 9 illustrates a cross-sectional view showing a semiconductor package according to an exemplary embodiment of the present inventive concepts.

Referring to FIG. 9, a semiconductor package according to an exemplary embodiment of the present inventive concepts may be, for example, a fan-out type panel-level package (PLP). The semiconductor package may include a lower package 31 and an upper package 32. The lower package 31 may include a lower substrate 300 having a cavity structure CR, a passive device structure PCS disposed in the cavity structure CR, coupling terminals 310 disposed on a bottom surface of the lower substrate 300, a first semiconductor chip 320 disposed on a top surface of the lower substrate 300, a first insulating layer 330 and a second insulating layer 340 disposed on a partial portion of the top surface of the lower substrate 300, a first molding layer 350 that covers lateral sides and a top surface of the first semiconductor chip 320 and the second insulating layer 340, and a third insulating layer 360 that covers a top surface of the first molding layer 350. The lower substrate 300 may be a semiconductor package substrate that is identical or similar to the exemplary embodiments discussed above with reference to FIGS. 2 to 8.

In an exemplary embodiment, the lower package 31 may be formed by a singulation process (e.g., a dicing process using a dicing saw) through which a unit package is separated from a package structure including a plurality of first semiconductor chips 320. In another exemplary embodiment, the lower package 31 may have a structure in which a plurality of fan-out type packages are stacked.

For example, the lower substrate 300 may be a redistribution substrate including a plurality of redistribution layers (RDL). The redistribution layers may result in an increase in the degree of freedom in designing coupling positions between the lower substrate 300 and external terminals.

The coupling terminals 310, such as solder balls, may be disposed on the bottom surface of the lower substrate 300. The coupling terminals 310 may be arranged (e.g., spaced apart) in the first direction D1. In an exemplary embodiment, the coupling terminals 310 may be electrically connected to external terminals of an electronic device, such as a mainboard.

The lower substrate 300 may include under-bump metal layers 301 and first, second, and third redistribution patterns 303, 305, and 307. The under-bump metal layers 301 may be connected to the coupling terminals 310. For example, a lower surface of the under-bump metal layers 301 may directly contact an upper surface of the coupling terminals 310. The cavity structure CR and the passive device structure PCS disposed in the cavity structure CR may be provided in one of regions between adjacent under-bump metal layers 301. The passive device structure PCS may include a first passive device PC1 and a second passive device PC2. The cavity structure CR and the passive device structure PCS may have features that are substantially the same as those in the prior exemplary embodiments discussed above, and explanation thereof will be omitted.

The first, second, and third redistribution patterns 303, 305, and 307 may be sequentially arranged in a third direction D3 from a top surface of each of the under-bump metal layers 301. The second redistribution patterns 305 may be disposed between the first redistribution patterns 303 and the third redistribution patterns 307. In an exemplary embodiment, one of the first, second, and third redistribution patterns 303, 305, and 307 may be electrically connected to one of first conductive pads CP1 coupled to the first passive device PC1 or one of second conductive pads CP2 coupled to the second passive device PC2. A portion of each of the first, second, and third redistribution patterns 303, 305, and 307 may have a width in the first direction D1 that gradually decreases in the third direction D3.

In an exemplary embodiment, each of the first, second, and third redistribution patterns 303, 305, and 307 may further include a barrier pattern that is conformally disposed on an upper portion thereof. In another exemplary embodiment, the semiconductor package may be configured such that the lower substrate 300 further includes therein redistribution patterns each of which is vertically connected to one of the first, second, and third redistribution patterns 303, 305, and 307.

The first semiconductor chip 320, the first insulating layer 330, and the second insulating layer 340 may be disposed on the lower substrate 300. However, exemplary embodiments of the present inventive concepts are not limited thereto and the semiconductor package may include various numbers of dielectric layers that are different from that shown in the exemplary embodiment of FIG. 9. Lateral sides of the first semiconductor chip 320 may be surrounded by the first insulating layer 330 and the second insulating layer 340. In an exemplary embodiment, the first semiconductor chip 320 may be, for example, a logic chip, a memory chip, or an application processor chip. When viewed in cross-section (e.g., in a plane defined in the first and third directions D1, D3), the first semiconductor chip 320 may be spaced apart from the first insulating layer 330 and the second insulating layer 340. For example, the first semiconductor chip 320 may be spaced apart from the first and second insulating layers 330, 340 in the first direction D1 with the first molding layer 350 disposed therebetween.

The first semiconductor chip 320 may have a bottom surface disposed adjacent to the lower substrate 300 and a top surface opposite to the bottom surface. For example, in an exemplary embodiment, the bottom surface may be an active surface of the first semiconductor chip 320, and the top surface may be an inactive surface of the first semiconductor chip 320. The first semiconductor chip 320 may include chip pads 321 on the bottom surface thereof. The chip pads 321 may be arranged in the first direction D1. In an exemplary embodiment, the number, pitch, and/or arrangement of the chip pads 321 may be different from those of the first, second, and third redistribution patterns 303, 305, and 307 and those of the coupling terminals 310. For example, the chip pads 321 may be more densely arranged than external terminals. The first semiconductor chip 320 may be electrically connected to external terminals through the chip pads 321, the first, second, and third redistribution patterns 303, 305, and 307, and the coupling terminals 310. In an another exemplary embodiment, the semiconductor package may further include a passivation layer that covers the bottom surface of the first semiconductor chip 320 and partial portions of bottom surfaces of the chip pads 321. In another exemplary embodiment, an interposer and an under-fill material may be interposed between the first semiconductor chip 320 and the chip pads 321 (e.g., in the third direction D3).

Interconnection layers 331 and first conductive patterns 333 may be disposed within the first insulating layer 330. The first conductive patterns 333 may partially protrude upwardly from a top surface of the first insulating layer 330. Second conductive patterns 341 may be disposed within the second insulating layer 340. The second conductive patterns 341 may partially protrude upwardly from a top surface of the second insulating layer 340.

The first molding layer 350 may be disposed to cover a top surface and lateral sides of the first semiconductor chip 320, lateral sides of the first insulating layer 330, and lateral sides of the second insulating layer 340. The first molding layer 350 may fill a through hole around the first semiconductor chip 320. The first molding layer 350 may include a partial portion that extends in the first direction D1 and covers the top surface of the first semiconductor chip 320 and the top surface of the second insulating layer 340, and may also include a partial portion that extends in the third direction D3 and fills the through hole. The first semiconductor chip 320 may be spaced apart from the first and second insulating layers 330 and 340 across a portion of the first molding layer 350. In an exemplary embodiment, the first molding layer 350 may include an Ajinomoto build-up film (ABF) or a dielectric polymer such as an epoxy-based polymer. However, exemplary embodiments of the present inventive concepts are not limited thereto.

Third conductive patterns 351 may be disposed within the first molding layer 350. The third conductive patterns 351 may partially protrude upwardly from a top surface of the first molding layer 350. The first molding layer 350 may partially cover the second conductive patterns 341, such as lateral ends of an upper surface of the second conductive patterns 341 and lateral sides of the portion of the second conductive patterns 341 that protrude upwardly from the second insulating layer 340. A portion of each of the first, second, and third conductive patterns 333, 341, and 351 may have a width in the first direction D1 that gradually increases in the third direction D3. In an exemplary embodiment, each of the first, second, and third conductive patterns 333, 341, and 351 may further include a barrier pattern that is conformally disposed on a lower portion thereof.

The third insulating layer 360 may be disposed to cover the first molding layer 350 and partial portions of top surfaces of the third conductive patterns 351. For example, as shown in the exemplary embodiment of FIG. 9, the third insulating layer 360 may cover lateral ends of the top surface of the third conductive patterns 351 and lateral sides of the third conductive patterns 351. The third insulating layer 360 may have openings 361 that externally expose partial portions of the top surfaces of the third conductive patterns 351, such as central portions of the top surfaces of the third conductive patterns 351. The openings 361 may each have a width in the first direction D1 that gradually increases in the third direction D3. A plurality of connection structures 371 may be disposed on the third conductive patterns 351 exposed through the openings 361. In an exemplary embodiment, the connection structures 371 may be, for example, solder balls or solder bumps.

The upper package 32 may include an upper substrate 370, a second semiconductor chip 381 and a third semiconductor chip 383 disposed on the upper substrate 370, and a second molding layer 380 that covers the upper substrate 370 and the second and third semiconductor chips 381 and 383. For example, as shown in the exemplary embodiment of FIG. 9, the second molding layer 380 may cover lateral sides of the second semiconductor chip 381 and the third semiconductor chip 383, a partial portion of the top surface of the second semiconductor chip 381 that is exposed by the third semiconductor chip 383 and the top portion of the third semiconductor chip 383. In an exemplary embodiment, each of the second and third semiconductor chips 381 and 383 may be, for example, a logic chip, a memory chip, or an application processor chip. The lower package 31 and the upper package 32 may be connected through the connection structures 371 disposed between the upper substrate 370 and the third conductive patterns 351.

The upper substrate 370 may include first connection pads 373 and second connection pads 375. As shown in the exemplary embodiment of FIG. 9, the first connection pads 373 may be disposed in a lower portion of the upper substrate 370 and the second connection pads 375 may be disposed in an upper portion of the upper substrate 370. For example, in another exemplary embodiment, the first connection pads 373 may be disposed on a lower surface of the upper substrate 370 and the second connection pads 375 may be disposed on an upper surface of the upper substrate 370. Each of the first connection pads 373 may be connected to one of the connection structures 371. The upper substrate 370 may be electrically connected to the lower substrate 300 through the first connection pads 373 and the connection structures 371.

As shown in the exemplary embodiment of FIG. 9, each of the second connection pads 375 may be electrically connected through a first bonding wire 391 and a second bonding wire 393 to the second semiconductor chip 381 and the third semiconductor chip 383, respectively. The second molding layer 380 may cover the second and third semiconductor chips 381 and 383. In an exemplary embodiment, the second molding layer 380 may include substantially the same material as that of the first molding layer 350. However, exemplary embodiments of the present inventive concepts are not limited thereto.

Figure 10:
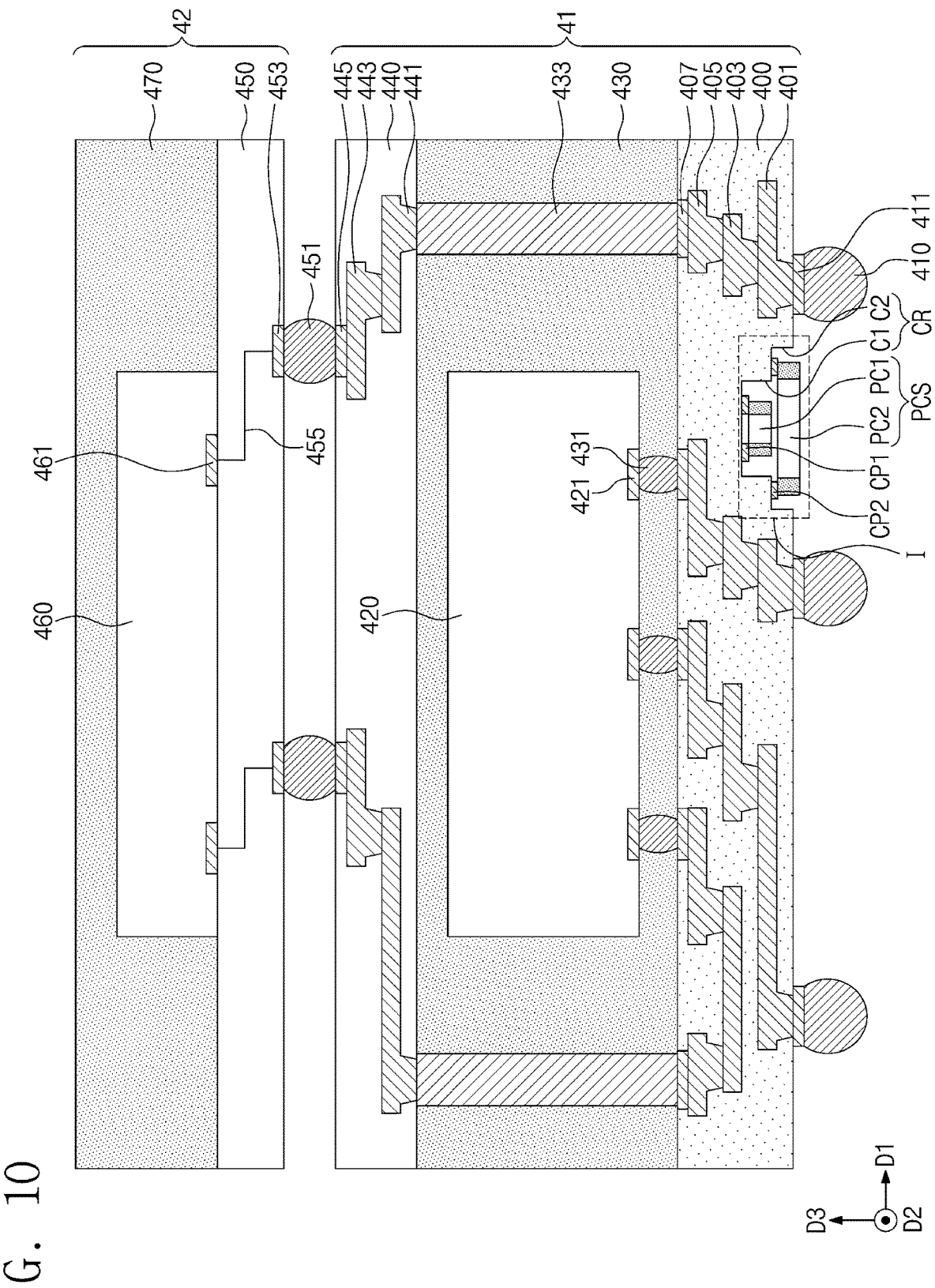

FIG. 10 illustrates a cross-sectional view showing a semiconductor package according to an exemplary embodiment of the present inventive concepts.

Referring to FIG. 10, a semiconductor package according to an exemplary embodiment of the present inventive concepts may be, for example, a fan-out type wafer-level package (WLP). The semiconductor package according to the present inventive concepts may include a lower package 41 and an upper package 42 disposed thereon. The lower package 41 may include a lower substrate 400 having a cavity structure CR, a passive device structure PCS disposed in the cavity structure CR, coupling terminals 410 disposed on a bottom surface of the lower substrate 400, a first molding layer 430 and a first semiconductor chip 420 disposed on a top surface of the lower substrate 400, and a dielectric layer 440 disposed on the first molding layer 430. The lower substrate 400 may be a semiconductor package substrate identical or similar to the exemplary embodiments discussed above with reference to FIGS. 2 to 8.

In an exemplary embodiment, the lower package 41 may be formed by a singulation process (e.g., a dicing process using a dicing saw) through which a unit package is separated from a package structure including a plurality of first semiconductor chips 420. In another exemplary embodiment, the lower package 41 may have a structure in which a plurality of fan-out type packages are stacked.

For example, the lower substrate 400 may be a redistribution substrate including a plurality of redistribution layers. The redistribution layers may provide an increase in the degree of freedom in designing coupling positions between the lower substrate 400 and external terminals.

The coupling terminals 410, such as solder balls, may be disposed on the bottom surface of the lower substrate 400. The coupling terminals 410 may be arranged in a first direction D1. In an exemplary embodiment, a plurality of coupling pads 411 may be disposed between the lower substrate 400 and the coupling terminals 410. The coupling terminals 410 may be connected to the lower substrate 400 through the coupling pads 411 disposed on the bottom surface of the lower substrate 400. In an exemplary embodiment, the coupling terminals 410 may be electrically connected to external terminals of an electronic device, such as a mainboard.

The lower substrate 400 may include first connection pads 407 and first, second, and third redistribution patterns 401, 403, and 405. The cavity structure CR and the passive device structure PCS disposed in the cavity structure CR may be positioned in one of regions between adjacent first redistribution patterns 401. The passive device structure PCS may include a first passive device PC1 and a second passive device PC2. The cavity structure CR and the passive device structure PCS may have features that are substantially the same as those in the exemplary embodiments discussed above, and explanation thereof will be omitted for convenience of explanation.

The first, second, and third redistribution patterns 401, 403, and 405 and the first connection pads 407 may be sequentially arranged in a third direction D3 from the bottom surface of the lower substrate 400. The second redistribution patterns 403 may be disposed between the first redistribution patterns 401 and the third redistribution patterns 405 (e.g., in the third direction D3). The third redistribution patterns 405 may be disposed between the second redistribution patterns 403 and the first connection pads 407 (e.g., in the third direction D3). In an exemplary embodiment, one of the first, second, and third redistribution patterns 401, 403, and 405 may be electrically connected to one of first conductive pads CP1 coupled to the first passive device PC1 or one of second conductive pads CP2 coupled to the second passive device PC2. A portion of each of the first, second, and third redistribution patterns 401, 403, and 405 may have a width in the first direction D1 that gradually increases in the third direction D3. In another exemplary embodiment, the semiconductor package may be configured such that the lower substrate 400 further includes redistribution patterns disposed therein and each of the redistribution patterns is vertically connected to one of the first, second, and third redistribution patterns 401, 403, and 405.

The lower substrate 400 may be provided thereon with the first semiconductor chip 420, the first molding layer 430 that surrounds the first semiconductor chip 420, first connection structures 431 that connect the first semiconductor chip 420 to ones of the first connection pads 407 of the lower substrate 400, and conductive posts 433 connected to the first connection pads 407 that are not connected to the first semiconductor chip 420.

In an exemplary embodiment, the first semiconductor chip 420 may be, for example, a logic chip, a memory chip, or an application processor chip. First chip pads 421 may be disposed in a lower portion the first semiconductor chip 420. For example, in another exemplary embodiment, the first chip pads 421 may be disposed on a lower surface of the first semiconductor chip 420. As shown in the exemplary embodiment of FIG. 10, the first chip pads 421 may be arranged in the first direction D1. In an exemplary embodiment, the number, pitch, and/or arrangement of the first chip pads 421 may be different from those of the first, second, and third redistribution patterns 401, 403, and 405 and those of the coupling terminals 410. For example, the first chip pads 421 may be arranged more densely than external terminals. The first semiconductor chip 420 may be electrically connected to external terminals through the first chip pads 421, the first connection structures 431, the first connection pads 407, the first, second, and third redistribution patterns 401, 403, and 405, and the coupling terminals 410. In another exemplary embodiment the semiconductor package may further include a passivation layer that covers a bottom surface of the first semiconductor chip 420 and partial portions of bottom surfaces of the first chip pads 421. In another exemplary embodiment, an interposer and an underfill material may be interposed between the first semiconductor chip 420 and the first chip pads 421.

The first molding layer 430 may surround the first semiconductor chip 420 and the first connection structures 431. The first molding layer 430 may have a top surface positioned at a higher level than the level of a top surface of the first semiconductor chip 420. For example, the first molding layer 430 may be disposed on a top surface of the first semiconductor chip 420, a partial portion of the bottom surface of the first semiconductor chip 420 and lateral sides of the first semiconductor chip 420. The conductive posts 433 may be disposed to penetrate the first molding layer 430. The conductive posts 433 may be connected with ones of the first connection pads 407 and may extend in the third direction D3.

The dielectric layer 440 may be disposed to cover the first molding layer 430 and the conductive posts 433. For example, the dielectric layer 440 may cover upper surfaces of the first molding layer 430 and the conductive posts 433. Fourth redistribution patterns 441, fifth redistribution patterns 443, and second connection pads 445 may be disposed within the dielectric layer 440. The fourth redistribution patterns 441, the fifth redistribution patterns 443, and the second connection pads 445 may be sequentially arranged in the third direction D3 from the top surface of the first molding layer 430. The fifth redistribution patterns 443 may be disposed between the fourth redistribution patterns 441 and the second connection pads 445 (e.g., in the third direction D3). A portion of each of the fourth and fifth redistribution patterns 441 and 443 may have a width in the first direction D1 that gradually increases in the third direction D3. In another exemplary embodiment, the semiconductor package may be configured such that redistribution patterns are included in the dielectric layer 440 and each of the redistribution patterns is vertically connected to one of the fourth and fifth redistribution patterns 441 and 443. In an exemplary embodiment, each of the first, second, third, fourth, and fifth redistribution patterns 401, 403, 405, 441, and 443 may further include a barrier pattern that is conformally disposed on a lower portion thereof.

The upper package 42 may include an upper substrate 450, a second semiconductor chip 460 disposed on the upper substrate 450, and a second molding layer 470 that covers a top surface of the upper substrate 450 and a top surface and lateral sides of the second semiconductor chip 460. In an exemplary embodiment, the second semiconductor chip 460 may be, for example, a logic chip, a memory chip, or an application processor chip. The lower package 41 and the upper package 42 may be connected to each other through second connection structures 451 disposed between the upper substrate 450 and the second connection pads 445 in the dielectric layer 440.

The upper substrate 450 may include third connection pads 453. For example, as shown in the exemplary embodiment of FIG. 10, the third connection pads 453 may be disposed in a lower portion of the upper substrate 450. For example, in another exemplary embodiment, the third connection pads 453 may be disposed on a lower surface of the upper substrate 450. Each of the third connection pads 453 may be connected to one of the second connection structures 451. The upper substrate 450 may be electrically connected to the lower substrate 400 through the third connection pads 453 and the second connection structures 451.

Second chip pads 461 may be disposed in a lower portion of the second semiconductor chip 460. For example, in another exemplary embodiment, the second chip pads 460 may be disposed on a lower surface of the second semiconductor chip 460. The second chip pads 461 may be electrically connected to the third connection pads 453 through interconnection layers 455 in the upper substrate 450. The second semiconductor chip 460 may be connected (e.g., electrically connected) to the lower package 41 through the second chip pads 461, the interconnection layers 455, the third connection pads 453, and the second connection structures 451. The second molding layer 470 may cover the upper substrate 450 and the second semiconductor chip 460. For example, as shown in the exemplary embodiment of FIG. 10, the second molding layer 470 may cover upper surfaces of the upper substrate 450 and the second semiconductor chip 460 and lateral sides of the second semiconductor chip 460.

FIG. 11 illustrates a cross-sectional view showing a semiconductor package according to an exemplary embodiment of the present inventive concepts. For convenience of description below, a repeated description of substantially similar elements described with respect to the exemplary embodiment of FIG. 10 may be omitted Referring to FIG. 11, a semiconductor package according to an exemplary embodiment of the present inventive concepts may include a lower package 51 and an upper package 52 disposed thereon. The lower package 51 may include a lower substrate 500 having a cavity structure CR, a passive device structure PCS disposed in the cavity structure CR, coupling terminals 510 disposed on a bottom surface of the lower substrate 500, a first semiconductor chip 520 and a first molding layer 530 disposed on a top surface of the lower substrate 500, and a dielectric layer 540 disposed on the first molding layer 530.

The coupling terminals 510 may be disposed on the bottom surface of the lower substrate 500 and may be in contact with the lower substrate 500. The lower substrate 500 may include coupling pads 501 and first, second, and third redistribution patterns 503, 505, and 507. The coupling pads 501 may be disposed on a lower portion of the lower substrate 500 and may be connected to the coupling terminals 510. The coupling pads 501 and the first, second, and third redistribution patterns 503, 505, and 507 may be sequentially disposed in a third direction D3 from the bottom surface of the lower substrate 500. The first redistribution patterns 503 may be disposed between the coupling pads 501 and the second redistribution patterns 505 (e.g., in the third direction D3). The second redistribution patterns 505 may be disposed between the first redistribution patterns 503 and the third redistribution patterns 507 (e.g., in the third direction D3). The passive device structure PCS may include a first passive device PC1 and a second passive device PC2. In an exemplary embodiment, one of the first, second, and third redistribution patterns 503, 505, and 507 may be electrically connected to one of first conductive pads CP1 coupled to the first passive device PC1 or one of second conductive pads CP2 coupled to the second passive device PC2. A portion of each of the first, second, and third redistribution patterns 503, 505, and 507 may have a width in the first direction D1 that gradually decreases in the third direction D3. In another exemplary embodiment, the semiconductor package may be configured such that redistribution patterns are disposed within the lower substrate 400 and each of the redistribution patterns is vertically connected to one of the first, second, and third redistribution patterns 503, 505, and 507.

The lower substrate 500 may be disposed thereon with the first semiconductor chip 520 and the first molding layer 530 that covers the first semiconductor chip 520. First chip pads 521 may be disposed in a lower portion of the first semiconductor chip 520. For example, in another exemplary embodiment, the first chip pads 521 may be disposed on a lower surface of the first semiconductor chip 520. The first molding layer 530 may not be interposed between the first semiconductor chip 520 and the lower substrate 500, and the first chip pads 521 may be in direct contact with ones of the third redistribution patterns 507. For example, as shown in the exemplary embodiment of FIG. 11, the first molding layer 530 may cover a top surface and lateral sides of the first semiconductor chip 520. A plurality of conductive posts 531 may be connected to the third redistribution patterns 507 that are not coupled to the first chip pads 521.

The dielectric layer 540 disposed on the first molding layer 530 and the conductive posts 531, fourth and fifth redistribution patterns 541 and 543 disposed in the dielectric layer 540, and first connection pads 545 disposed in the dielectric layer 540 may be substantially the same as their respective components of the semiconductor package shown in the exemplary embodiment of FIG. 10. The upper package 52 may include an upper substrate 550, a second semiconductor chip 560 disposed on the upper substrate 550, and a second molding layer 570 that covers the upper substrate 550 and the second semiconductor chip 560, and may be substantially the same as the upper package 42 of the semiconductor package shown in the exemplary embodiment of FIG. 10.

According to exemplary embodiments of the present inventive concepts, a semiconductor package substrate may have on its lower portion a cavity in which a passive device is disposed, and thus it may be possible to increase electrical characteristics of the semiconductor package substrate and to reduce a total thickness of a semiconductor package including the semiconductor package substrate.

Furthermore, the semiconductor package substrate according to exemplary embodiments of the present inventive concepts may be configured such that at least two passive devices are each connected to a substrate, which may result in an increase in the degree of freedom for wiring design.

Although the present inventive concepts have been described in connection with the some exemplary embodiments illustrated in the accompanying drawings, it will be understood by one of ordinary skill in the art that variations in form and detail may be made therein without departing from the spirit and essential feature of the present inventive concepts. Therefore, the above disclosed exemplary embodiments should be considered illustrative and not restrictive.

What is claimed is:

1. A semiconductor package substrate, comprising:
   a substrate having a bottom surface including a cavity structure defined therein, the cavity structure including a floor surface, a first cavity and a second cavity, the first and second cavities having different widths from each other; and
   a passive device structure having at least a partial portion of the passive device structure disposed in the cavity structure,
   wherein the passive device structure includes a first passive device and a second passive device that are each connected to the floor surface of the cavity structure,
   wherein at least partial portions of the first passive device and the second passive device vertically overlap each other,
   wherein a longest dimension of the first passive device is perpendicular to a longest dimension of the second passive device, wherein the first passive device is disposed in the first cavity and is not disposed in the second cavity, and wherein the second passive device is disposed in the second cavity and is not disposed in the first cavity.

2. The semiconductor package substrate of claim 1, further comprising:
a coupling terminal that protrudes downwardly from the bottom surface of the substrate,
wherein a protrusion height is in a range of about 10 μm about 140 μm, the protrusion height is defined as a distance between the bottom surface of the substrate and a lowermost point of the coupling terminal.

3. The semiconductor package substrate of claim 1, wherein the first passive device and the second passive device extend longitudinally in parallel along a first direction.

4. The semiconductor package substrate of claim 3, wherein a total length in the first direction of the first passive device is less than a total length in the first direction of the second passive device.

5. The semiconductor package substrate of claim 3, wherein:
the first passive device includes a plurality of first electrodes disposed at opposite lateral ends and a first dielectric layer disposed between the plurality of first electrodes;
the second passive device includes a plurality of second electrodes disposed at opposite lateral ends and a second dielectric layer disposed between the plurality of second electrodes;
the plurality of first electrodes do not vertically overlap the plurality of second electrodes; and
the plurality of first electrodes vertically overlap the second dielectric layer.

6. The semiconductor package substrate of claim 1, wherein:
the first passive device longitudinally extends in a first direction; and
the second passive device longitudinally extends in a second direction intersecting the first direction.

7. The semiconductor package substrate of claim 6, wherein:
the first passive device includes a plurality of first electrodes disposed at opposite lateral ends and a first dielectric layer disposed between the plurality of first electrodes;
the second passive device includes a plurality of second electrodes disposed at opposite lateral ends and a second dielectric layer disposed between the plurality of second electrodes;
the plurality of first electrodes do not vertically overlap the plurality of second electrodes; and
a partial portion of the first dielectric layer vertically overlaps the second dielectric layer.

8. The semiconductor package substrate of claim 7, wherein the plurality of first electrodes and the plurality of second electrodes are spaced apart from a sidewall of the cavity structure.

9. The semiconductor package substrate of claim 1, further comprising:
a plurality of first conductive pads and a plurality of second conductive pads disposed on the floor surface of the cavity structure or the bottom surface of the substrate,
wherein the plurality of first conductive pads is positioned at a level that is different from a level of the plurality of second conductive pads, and wherein the first passive device and the second passive device are connected to the plurality of first conductive pads and the plurality of second conductive pads, respectively.

10. The semiconductor package substrate of claim 1, wherein:
the cavity structure includes a plurality of cavity structures disposed on the bottom surface of the substrate; and
the passive device structure is disposed in each of the plurality of cavity structures.

11. A semiconductor package substrate, comprising:
a substrate having a bottom surface including a cavity structure defined therein, the cavity structure includes a first cavity and a second cavity, the first and second cavities having a step difference therebetween; and
a passive device structure disposed in the cavity structure, the passive device structure including a first passive device and a second passive device that are each connected to a floor surface of the cavity structure,
wherein the first cavity and the second cavity have different widths from each other, and
wherein the first passive device is disposed in the first cavity and is not disposed in the second cavity, and
wherein the second passive device is disposed in the second cavity and is not disposed in the first cavity, and
wherein a longest dimension of the first passive device is perpendicular to a longest dimension of the second passive device.

12. The semiconductor package substrate of claim 11, wherein:
the first passive device and the second passive device are spaced apart from each other in a direction perpendicular to the bottom surface of the substrate; and
at least a partial portion of the first passive device and the second passive device vertically overlap each other.

13. The semiconductor package substrate of claim 11, wherein:
the first passive device and the second passive device extend longitudinally in parallel along a first direction; and
a total length in the first direction of the first passive device is less than a total length in the first direction of the second passive device.

14. The semiconductor package substrate of claim 11, wherein:
the first passive device extends longitudinally in a first direction; and
the second passive device extends longitudinally in a second direction intersecting the first direction.

15. The semiconductor package substrate of claim 11, wherein:
the first passive device includes a plurality of first electrodes disposed at opposite lateral ends and a first dielectric layer disposed between the plurality of first electrodes;
the second passive device includes a plurality of second electrodes disposed at opposite lateral ends and a second dielectric layer disposed between the plurality of second electrodes; and
the plurality of first electrodes do not vertically overlap the plurality of second electrodes.

16. The semiconductor package substrate of claim 11, further comprising:
a coupling terminal that protrudes downwardly from the bottom surface of the substrate, wherein a protrusion height is in a range of about 10 μm to about 140 μm, the protrusion height is defined as a distance between the bottom surface of the substrate and a lowermost point of the coupling terminal.

17. The semiconductor package substrate of claim 11, wherein:
the first passive device is spaced apart from a sidewall of the first cavity; and
the second passive device is spaced apart from a sidewall of the second cavity.

18. The semiconductor package substrate of claim 11, wherein:
the cavity structure includes a plurality of cavity structures disposed on the bottom surface of the substrate; and
the passive device structure is disposed in each of the plurality of cavity structures.

19. A semiconductor package, comprising:
a substrate having a bottom surface including a cavity structure defined therein, the cavity structure including a first cavity and a second cavity, the first and second cavities having a step difference therebetween;
a plurality of first conductive pads disposed on a floor surface of the first cavity;
a plurality of second conductive pads disposed on a floor surface of the second cavity;
a plurality of conductive vias disposed in the substrate, each of the plurality of conductive vias is connected to one of the plurality of first and second conductive pads;
a plurality of coupling terminals disposed on the bottom surface of the substrate;
a first passive device disposed in the first cavity and electrically connected to the plurality of first conductive pads, the first passive device is not disposed in the second cavity; and
a second passive device disposed in the second cavity and electrically connected to the plurality of second conductive pads, the second passive device is not disposed in the first cavity,
wherein each of the first and second passive devices includes a plurality of electrodes disposed at opposite lateral ends and a dielectric layer disposed between the electrodes, at least a partial portion of the first and second passive devices vertically overlapping each other,
wherein a longest dimension of the first passive device is perpendicular to a longest dimension of the second passive device.

20. The semiconductor package of claim 19, wherein:
the first cavity and the second cavity have different widths from each other; and
the first passive device and the second passive device have different lengths from each other.

* * * * *